United States Patent [19]

Yamamoto et al.

[11] Patent Number: 4,912,011
[45] Date of Patent: Mar. 27, 1990

[54] IMAGE-RECORDING METHOD COMPRISING HEATING A LIGHT-SENSITIVE MATERIAL CONTAINING MICROCAPSULE

[75] Inventors: Soichiro Yamamoto, Kanagawa; Shun-ichi Ishikawa; Fumiaki Shinozaki, both of Shizuoka; Hideki Ohmatsu, Kanagawa, all of Japan

[73] Assignee: Fuji Photo Film Co., Ltd., Kanagawa, Japan

[21] Appl. No.: 201,334

[22] Filed: May 31, 1988

Related U.S. Application Data

[63] Continuation of Ser. No. 868,385, May 29, 1986, abandoned.

[30] Foreign Application Priority Data

May 30, 1985 [JP] Japan .................................. 60-117089
Jun. 4, 1985 [JP] Japan .................................. 60-121284
Jun. 26, 1985 [JP] Japan .................................. 60-139746

[51] Int. Cl.$^4$ .......................... G03C 1/72; G03C 5/54
[52] U.S. Cl. ................................... 430/138; 430/203; 430/253; 430/254; 430/281; 430/292; 430/617
[58] Field of Search ............... 430/138, 292, 281, 336, 430/338, 203

[56] References Cited

U.S. PATENT DOCUMENTS

| 4,177,469 | 12/1979 | Peterson | 346/110 R |
| 4,430,415 | 2/1984 | Aono et al. | 430/138 |
| 4,440,846 | 4/1984 | Sanders et al. | 430/138 |
| 4,500,624 | 2/1985 | Aono et al. | 430/138 |
| 4,529,681 | 7/1985 | Usami et al. | 430/138 |
| 4,536,463 | 8/1985 | Sanders | 430/138 |
| 4,562,137 | 12/1985 | Sanders | 430/138 |
| 4,629,678 | 12/1986 | Hayakawa et al. | 430/203 |

FOREIGN PATENT DOCUMENTS 174634  3/1986  European Pat. Off. .
866631  4/1961  United Kingdom .

OTHER PUBLICATIONS

Derwent Abstract for German Patent 3,206,030 (Inoue) entitled "Process for Production of Polymeric Images and Printing Plates", 9/9/82.

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material and an image recording method using the same are disclosed. The material comprises a support having provided thereon a light sensitive layer containing at least a light-sensitive silver halide, a reducing agent, a polymerizable compound, and a color image forming substance, wherein at least the polymerizable compound and the color image forming substance are encapsulated in the same microcapsules. The material exhibits high sensitivity and excellent stability with time.

7 Claims, No Drawings

IMAGE-RECORDING METHOD COMPRISING HEATING A LIGHT-SENSITIVE MATERIAL CONTAINING MICROCAPSULE

This is a continuation of application Ser. No. 868,385 filed May 29, 1986 now abandoned.

FIELD OF THE INVENTION

This invention relates to a light-sensitive material containing microcapsules (inclusive of oil droplets having no capsule wall) containing a polymerizable compound and a color image forming substance and to an image recording method using the same. More particularly, it relates to a light-sensitive material in which a light-sensitive silver halide is used as a sensor to form a latent image thereon when imagewise irradiated with actinic radiation, and a polymeric compound is imagewise formed by making use of the latent image to thereby immobilize a coexisting color image forming substance.

BACKGROUND OF THE INVENTION

Various types of recording materials utilizing microcapsules are hitherto known. For example, U.S. Pat. No. 3,219,446 (corresponding to Japanese Patent Publication No. 14344/67) discloses a method, in which a light-sensitive sheet having numerous droplets of a fluid is imagewise exposed to light to thereby immobile the fluid, and the exposed sheet is superposed on an image-receiving sheet, followed by applying pressure all over the sheet to transfer an image corresponding to exposure onto the image-receiving sheet.

Japanese Patent Application (OPI) No. 89915/77 (the term "OPI" used herein means "unexamined published application") discloses a method for obtaining an image in which one component of two-component type heat-sensitive color forming system and a photopolymerizable monomer are encapsulated, and a mixture of another component of the heatsensitive color forming system and the microcapsules is coated on a base to form a light-sensitive sheet, which is imagewise exposed to light to cure the microcapsules in the exposed areas followed by uniformly heating to develop a color on only the unexposed areas.

Japanese Patent Application (OPI) Nos. 124343/82, 179836/82, and 197538/82 disclose an image formation method using microcapsules containing a vinyl compound, a photopolymerization initiator, and a dye precursor, by which a dye image can be obtained by applying pressure all over the material after exposure without requiring heating.

U.S. Pat. No. 3,700,439 (corresponding to Japanese Patent Publication No. 20852/79) discloses an image formation method in which Michler's ketone is encapsulated as a light-sensitive material.

Further, U.S. Pat. No. 3,072,481 discloses a light and pressure-sensitive image formation method, in which a photosensitive substance that easily forms color upon exposure to light when in a dissolved state but is light-insensitive in a solid state is encapsulated, which method comprising imagewise exposing a layer containing the microcapsules and then rupturing the microcapsules to evaporate the solvent.

However, all of the foregoing image formation methods using microcapsules have low sensitivity to light, especially to green light or red light. Furthermore, attempts to increase the sensitivity in these methods are attended by reductions in preservability.

On the other hand, various image formation methods utilizing silver halides as photo-sensor, excluding so-called conventional photographic light-sensitive materials, are known.

For example, British Pat. No. 866,631 discloses a method, in which photopolymerization is directly induced by using a silver halide as a catalyst. According to this method, a product resulting from photolysis of a silver halide is considered to act as a catalyst for polymerization, and high sensitivity as attained by reduction of silver halides through general development processing cannot be obtained.

Belgian Pat. No. 642,477 describes a method which comprises developing exposed silver halide grains with a general developer and inducing polymerization using the resulting silver image or the unreacted silver halide as a catalyst to imagewise form a polymeric compound. However, this method involves complicated operation.

Further, U.S. Pat. No. 3,697,275 (corresponding to Japanese Patent Publication No. 11149/70), U.S. Pat. No. 3,687,667 (corresponding to Japanese Patent Publication No. 20741/72), U.S. Pat. No. 3,746,542 (corresponding to Japanese Patent Application (OPI) No. 10697/74) and Japanese Patent Application (OPI) Nos. 138632/82 and 169143/83 propose a method in which an exposed silver halide is developed with a reducing agent and a coexisting vinyl compound initiates polymerization simultaneously with oxidation of the reducing agent to imagewise form a high-molecular compound. This method, however, requires a development step using a liquid.

However, any of these known image formation methods using silver halides as a photo-sensor has certain disadvantages, such as that high sensitivity cannot be obtained, or complicated development processing procedures are required.

SUMMARY OF THE INVENTION

An object of this invention is to provide a light-sensitive material having high sensitivity and excellent stability with time. The expression "stability with time" as used herein refers to stability of a light-sensitive material before heat development in photographic performance properties, such as maximum density, minimum density, sensitivity, etc., during preservation.

Another object of this invention is to provide an image recording method using such a light-sensitive material.

The above objects can be accomplished by a light-sensitive material comprising a support having carried thereon at least a light-sensitive silver halide emulsion, a reducing agent, a polymerizable compound, and a color image forming substance, wherein at least the polymerizable compound and the color image forming substance are encapsulated in the same microcapsules (inclusive of oil droplets having no capsule wall).

In another aspect, the invention relates to an image-recording method which comprises imagewise exposing a light-sensitive material as described above to form a latent image, heating the light-sensitive material either simultaneously with or after the imagewise exposure to polymerize the polymerizable compound, to thereby cure the microcapsules, and pressing the light-sensitive material in contact with an image-receiving material to which said color image-forming substance can be transferred, to rupture at least part of the microcapsules in the area wherein said polymerizable compound has not been polymerized, to thereby transfer said color image-forming substance to said image-receiving material.

DETAILED DESCRIPTION OF THE INVENTION

In the light-sensitive material according to the present invention, a light-sensitive silver halide forms a latent image as a photo-sensor upon exposure to light, and the thus formed latent image nucleus acts as a catalyst to cause oxidation-reduction reaction between a silver salt and a reducing agent. A polymerization reaction is then initiated in the presence of a radical intermediate that is formed by the oxidation-reduction reaction or a radical that is formed by the oxidation-reduction reaction followed by a reaction between the resulting reaction product and another compound. It is not easily anticipated from the conventional knowledge that the above-described serial reaction can be remarkably accelerated by heating or uniform exposure. In particular, it is an entirely surprising finding that a radical intermediate is formed through the reaction between a silver salt and a reducing agent in a dry process using no developer.

According to the present invention, it is possible to form a polymeric compound in either the exposed areas or the unexposed areas, depending on the type of the light-sensitive silver halide. The areas wherein a polymeric compound has been formed has increased pressure resistance as compared with the area wherein a polymeric compound has not been formed so that a color image comprising a color image forming substance can be formed by, for example, transferring the latter area to an image-receiving material by pressure application. Therefore, it is possible, in the present invention, to provide an image either negative or positive to an original, according to the type of the light-sensitive silver halide used or the color image formation process adopted. In some cases, it is also possible to form both a negative image and a positive image at the same time.

For instance, in the case of obtaining a color image by transfer of the area wherein no polymeric compound is formed, an image positive to an original can be obtained by the use of a general negative silver halide emulsion. To the contrary, a negative image can be obtained by using an inner image type silver halide emulsion as described in U.S. Pat. Nos. 3,206,313, 3,367,778 and 3,447,927 or a mixture of a surface image type silver halide emulsion and an inner image type silver halide emulsion as described in U.S. Pat. No. 2,996,382.

In order to obtain colors having a wide range of a chromaticity diagram sing three primary colors according to a subtractive color process, i.e., yellow, magenta and cyan, a light-sensitive material should contain at least three silver halide emulsions having respective light-sensitivity to different spectral regions. A typical combination of the three light-sensitive silver halide emulsions having sensitivity to different spectral regions includes a combination of a blue-sensitive emulsion, a green-sensitive emulsion, and a red-sensitive emulsion, a combination of a green-sensitive emulsion, a red-sensitive emulsion, and an infrared-sensitive emulsion, a combination of a blue-sensitive emulsion, a green-sensitive emulsion, and an infrared-sensitive emulsion, a combination of a blue-sensitive emulsion, a red-sensitive emulsion and an infrared-sensitive emulsion, and the like. An infrared-sensitive emulsion as herein referred to means an emulsion having light-sensitivity to light of 700 nm or more, and particularly 740 nm or more.

For example, if a combination of a blue-sensitive emulsion, a green-sensitive emulsion and a red-sensitive emulsion is used, an intended object for full color imaging can be achieved by incorporating a yellow image forming substance into blue-sensitive microcapsules inclusive of oil droplets (hereinafter simply referred to microcapsules), a magenta image forming substance into green-sensitive microcapsules, and a cyan image forming substance into red-sensitive microcapsules, respectively.

Use of microcapsules as described above makes it possible to separately incorporate each of yellow, magenta, and cyan image forming substances into the same light-sensitive element, by which a color image can be formed through simple and easy operation.

Color image forming according to the above-described conventional techniques unavoidably encounters disadvantages such as that: (1) low or no sensitivity to green light or red light is obtained; (2) sensitivity to blue light is low; (3) stability prior to use is poor; (4) complicated operation is required; (5) processing with a liquid is involved; and the like. All of these disadvantages associated with the conventional techniques can be overcome by the light-sensitive material of this invention. Hence, the light-sensitive material according to the present invention produces great effects particularly when applied to color image formation.

A light-sensitive element and an image-receiving element according to the invention will be illustrated below.

The light-sensitive element as herein referred to indicate an element containing a light-sensitive silver halide, a reducing agent, a polymerizable compound and a color image forming substance, of which at least the polymerizable compound and the color image forming substance are encapsulated in the same microcapsules. The image-receiving element as herein referred to indicate an element in which a color image forming substance released from the light-sensitive element is fixed to form a color image. Embodiments of these elements and image formation methods are set forth below, but the present invention is not limited thereto.

1. An embodiment wherein the color image forming substance is a dye or a pigment, in which:
   (a) a light-sensitive element and an image-receiving element are separately provided on different supports to form a light-sensitive material and an image-receiving material, respectively. The light-sensitive element is imagewise exposed to light followed by heating or uniform exposure to light, and pressure is then applied to the material in contact with the image-receiving material to form a color image on the image-receiving material.
   (b) A support is coated with a light-sensitive material, a light-reflecting layer and an image-receiving layer, in the order listed. After the light-sensitive material is imagewise exposed to light, followed by heating or uniform exposure to light, pressure is applied thereto to imagewise transfer the color image forming substance to the image-receiving element to thereby form a color image on the image-receiving element.

2. An embodiment wherein a color forming substance is per se colorless or lightly colored but develops a color upon application of energy. In this case, the same emdobiments as in 1-(a) and (b) above are included, but an additional step of energy application to cause the color image forming substance to develop a color is required in either case. However, when the color formation takes place concurrently with the heating or exposure or the pressure application, no special step is necessary.

3. An embodiment wherein the color image forming substance (in this case, called a color former) is per se colorless or lightly colored but develops a color when contacted with another component (called a developer).

(a) The same embodiment as in 1-(a) above, wherein the image-receiving element further contains a developer. In this case, the color image forming substance and the developer are brought into contact with each other by pressure application to form a color image.
  (b) The same embodiment as in 1-(b) above, wherein the image-receiving element further contains a developer. In this case, the color image forming substance and the developer are brought into contact with each other by pressure application to form a color image.
  (c) A support is coated with a light-sensitive element and an image-receiving element being adjacent to each other or with a mixture of components of the two elements. In either case, with a developer being employed as a component constituting the image-receiving element, when the light-sensitive material (also serving as an image-receiving material) is imagewise exposed, followed by heating or uniformly exposing to light, and pressure is then applied thereto, the color image forming substance and the developer are brought into contact with the vicinity of the ruptured microcapsules to thereby form a color image. In this embodiment, a visual image can be directly obtained, since the color image forming substance in the non-developed area is substantially colorless.

Silver halides which can be used in the present invention may be any of silver chloride, silver bromide, silver iodide, silver chlorobromide, silver chloroiodide, silver iodobromide, and silver chloroiodobromide. The halogen composition of individual grains may be homogeneous or may be heterogeneous to form an outer shell and a core in a multilayered structure as described in Japanese Patent Application (OPI) Nos. 154232/82, 108533/83, 48755/84 and 52237/84, U.S. Pat. No. 4,433,048 and European Patent 100,984. Tabular (plate-like) grains having a thickness not more than 0.5 $\mu$m, a diameter of at least 0.6 $\mu$m and a mean aspect ratio of not less than 5 as described in U.S. Pat. Nos. 4,414,310 and 4,435,499 and West German Patent Publication (OLS) No. 3241646A$_1$, etc., or a mono-dispersed emulsion having nearly uniform grain size distribution as described in Japanese Patent Application (OPI) Nos. 178235/82, 100846/83 and 14829/83, International Patent Publication 83/02338A$_1$, European Patents 64,412A$_3$ and 83,377A$_1$, etc., can also be used in the present invention. Two or more kinds of silver halide different in crystal habit, halogen composition, grain size, grain size distribution, and the like may be used in combination. A mixture of two or more kinds of mono-dispersed emulsions being different in grain size may be used in order to control gradation.

The silver halide grains to be used in the invention preferably have a mean diameter of from 0.001 to 10 $\mu$m, and more preferably from 0.001 to 5 $\mu$m. The silver halide emulsion can be prepared by any of the acid process, the neutral process and the ammonia process. The soluble silver salt and the halogen salt can be reacted in accordance with a single jet process, a double jet process or a combination thereof. A reverse mixing method, in which grains are formed in the presence of excess silver ions, or a controlled double jet process, in which a pAg value is maintained constant, can also be employed. In order to accelerate grain growth, the concentrations or amounts of the silver salt and halogen salt to be added or the rate of their addition may be increased as described in Japanese Patent Application (OPI) Nos. 142329/80 and 158124/80, U.S. Pat. No. 3,650,757, etc.

Epitaxially grown silver halide grains as described in Japanese Patent Application (OPI) No. 16124/81 and U.S. Pat. No. 4,094,684 may also be used.

When silver halides are used alone without using any organic silver salt oxidizing agent in combination, preferred silver halides are silver chloroiodide, silver iodobromide and silver chloroiodobromide that show an appreciable X-ray pattern for silver iodide crystals, For example, silver iodobromide having such a characteristic can be obtained by adding a silver nitrate solution to a potassium bromide solution to form silver bromide grains and then adding potassium iodide thereto.

In the formation of silver halide grains to be used in the invention ammonia, an organic thioether derivative as described in Japanese Patent Publication No. 11386/72 or a sulfur-containing compound as described in Japanese Patent Application (OPI) No. 144319/78 can be used as a silver halide solvent. In the grain formation or physical ripening, a cadmium salt, a zinc salt, a lead salt, a thallium salt, etc., may be present in the system.

For the purpose of improving high or low intensity reciprocity law failure, a water-soluble iridium salt, e.g., iridium (III, IV) chloride, ammonium hexachloroiridate, etc., or a water-soluble rhodium salt, e.g., rhodium chloride, etc., can be used.

The silver halides are used in the form of emulsion. After the grain formation or physical ripening, soluble salts may be removed from the resulting emulsion by a known noodle washing method or a sedimentation method. The silver halide emulsion may be used as being primitive, but is usually subjected to chemical sensitization. Chemical sensitization can be carried out by sulfur sensitization, reduction sensitization or noble metal sensitization, or a combination thereof that are known for emulsions for general light-sensitive materials. The chemical sensitization can be effected in the presence of a nitrogen-containing heterocyclic compound as disclosed in Japanese Patent Application (OPI) Nos. 126526/83 and 215644/83.

The silver halide emulsion of the present invention may be of a surface latent image type that forms a latent image predominantly on the surface of silver halide grains or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 3534/83 and Japanese Patent Application (OPI) No. 136641/82, etc. The nucleating agent that is preferably combined with the inner latent image type emulsion is described in U.S. Pat. Nos. 3,227,552, 4,245,037, 4,255,511, 4,266,013 and 4,276,364 and West German Patent Publication (OLS) No. 2,635,316.

The light-sensitive silver halide is coated to a silver coverage of from 1 mg to 10 g per m$^2$.

The silver halide which can be used in the present invention may be spectrally sensitized with dyes. Sensitizing dyes to be used include methine dyes, cyanine dyes, merocyanine dyes, complex cyanine dyes, complex merocyanine dyes, holopolar cyanine dyes, hemicyanine dyes, styryl dyes, and hemioxonol dyes. Of these, cyanine dyes, merocyanine dyes and complex merocyanine dyes are particularly useful. Any of basic heterocyclic nuclei generally used in cyanine dyes can be applied to these sensitizing dyes. Such nuclei include a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, etc.; these nuclei to which an alicyclic hydrocarbon ring is fused; and these nuclei to which an aromatic hydrocarbon ring is fused, e.g., an indolenine nucleus, a benzindolenine nucleus, an indole nucleus, a benzoxazole nucleus, a naphthoxazole nucleus, a benzothiazole nucleus, a naphthothiazole nucleus, a benzoselenazole nucleus, a benzimidazole nucleus, a quinoline nucleus, etc. These nuclei may have substituents on their carbon atoms.

To the merocyanine dyes or complex merocyanine dyes can be applied 5- or 6-membered heterocyclic nuclei having a ketomethylene structure, such as a pyrazolin-5-one nucleus, a thiohydantoin nucleus, a 2-thiooxazolidine-2,4-dione nucleus, a thiazolidine-2,4-dione nucleus, a rhodanine nucleus, a thiobarbituric acid nucleus, etc.

These sensitizing dyes may be used either individually or in combinations thereof. Combinations of sensitizing dyes are often used for the purpose of supersensitization.

The emulsion may contain, in addition to the sensitizing dyes, a substance which does not per se exhibit spectral sensitization effect or does not substantially absorb visible light but shows supersensitizing activity. Such a substance includes aminostyryl compounds substituted with a nitrogen-containing heterocyclic group as described in U.S. Pat. Nos. 2,933,390 and 3,635,721, aromatic organic acid-formaldehyde condensates as described in U.S. Pat. No. 3,743,510, cadmium salts, azaindene compounds, and the like. In particular, combinations described in U.S. Pat. Nos. 3,615,613, 3,615,641, 3,617,295, and 3,635,721 are useful.

The above-described sensitizing dyes may be incorporated into the silver halide emulsion by directly dispersing or by once dissolving in a solvent, e.g., water, methanol, ethanol, acetone methyl cellosolve, etc., or a mixture thereof, and then adding the solution to the emulsion. They may be first dissolved in a substantially water-immiscible solvent, e.g., phenoxyethanol, etc., and then dispersed in water or a hydrophilic colloid, and the dispersion is added to the emulsion. Further, the sensitizing dyes may be added to the emulsion simultaneously with an oleophilic compound, such as a dye-donative compound, etc., in the form of a mixture. In the case of forming a dye solution, sensitizing dyes to be used in combination may be dissolved individually or a mixture of these dyes may be dissolved all at once. Moreover, the dye solutions may be added to the emulsion in the form of a mixture thereof, or each of the solutions may be added simultaneously. Addition of the sensitizing dyes to the emulsion can be effected during or before or after the chemical ripening, or before or after the nucleus formation of silver halide grains as described in U.S. Pat. Nos. 4,183,756 and 4,225,666.

The amount of the sensitizing dye to be added generally ranges from about $10^{-8}$ to about $10^{-2}$ mol per mol of silver halide.

In the case of adding the sensitizing dye during the silver halide grain formation, a suitable concentration of the sensitizing dye in the reaction mixture is 1% by weight or less, and preferably 0.1% by weight or less.

In the present invention, an organic silver halide that is relatively stable to light can be used as an oxidizing agent in combination with the light-sensitive silver halide. Such being the case, it is necessary that the light-sensitive silver halide and the organic silver salt be in contact with each other or lie close together. It is believed that the organic silver salt oxidizing agent takes part in a redox reaction using a silver halide latent image as a catalyst when heated to a temperature of 80° C. or higher, and preferably 100° C. or higher.

Organic compounds which can be used for forming such an organic silver salt oxidizing agent include aliphatic or aromatic carboxylic acids, thiocarbonyl group-containing compounds having a mercapto compound or an α-hydrogen atom, imino group-containing compounds, and the like.

Typical examples of silver salts of the aliphatic carboxylic acids include those derived from behenic acid, stearic acid, oleic acid, lauric acid, capric acid, myristic acid, palmitic acid, maleic acid, fumaric acid, tartaric acid, furonic acid, linolic acid, linoleic acid, adipic acid, sebacic acid, succinic acid, acetic acid, butyric acid or camphoric acid. Silver salts derived from the above-enumerated fatty acids substituted with a halogen atom or a hydroxyl group or aliphatic carboxylic acids having a thioether group may also be used.

Typical examples of silver salts of the aromatic carboxylic acids or other carboxyl group-containing compounds include those derived from benzoic acid, 3,5-dihydroxybenzoic acid, o-, m- or p-methylbenzoic acid, 2,4-dichlorobenzoic acid, acetamidobenzoic acid, p-phenylbenzoic acid, gallic acid, tannic acid, phthalic acid, terephthalic acid, salicyclic acid, phenylacetic acid, pyromellitic acid, 3-carboxymethyl-4-methyl-4-thiazoline-2-thione, etc.

Examples of silver salts of the mercapto group- or thiocarbonyl group-containing compounds are those derived from 3-mercapto-4-phenyl-1,2,4-triazole, 2-mercaptobenzimidazole, 2-mercapto-5-aminothiadiazole, 2-mercaptobenzothiazole, S-alkylthioglycolic acids having from 12 to 22 carbon atoms in the alkyl moiety thereof, dithiocarboxylic acids, e.g., dithioacetic acid, etc., thioamides, e.g., thiostearamide, etc., or mercapto compounds described in U.S. Pat. No. 4,123,274, e.g., 5-carboxy-1-methyl-2-phenyl-4-thiopyridine, mercaptotriazine, 2-mercaptobenzoxazole, mercaptooxadiazole, 3-amino-5-benzylthio-1,2,4-triazole, etc.

Typical examples of silver salts of the imino group containing compounds include those derived from benzotriazole or derivatives thereof as described in Japanese Patent Publication Nos. 30270/69 and 18416/70, such as benzotriazole, alkyl-substituted benzotriazoles, e.g., methylbenzotriazole, etc., halogen-substituted benzotriazoles, e.g., 5-chlorobenzoptriazole, etc., and carboimidobenzotriazoles, e.g., butylcarboimidobenzotriazole, etc.; nitrobenzotriazoles as described in Japanese Patent Application (OPI) No. 118639/83; sulfobenzotriazole, carboxybenzotriazole or salts thereof or hydroxybenzotriazole as described in Japanese Patent Application (OPI) No. 118638/83; 1,2,4-triazole, 1H-tetrazole, carbazole, saccharin or imidazole or derivatives thereof as described in U.S. Pat. No. 4,220,709; and the like.

In addition, silver salts or organic metal salts other than silver salts, e.g., copper stearate, as described in *Research Disclosure*, RD No. 17029 (June 1978) and silver salts of alkynyl group-containing carboxylic acids, e.g., phenylpropiolic acid, as described in Japanese Patent Application No. 221535/83 can also be used in the present invention.

The above-described organic silver salt can be used in an amount of from 0.01 to 10 mols, and preferably from 0.01 to 1 mol, per mol of a light-sensitive silver halide. A total coverage of the light-sensitive silver halide and the organic silver salt suitably ranges from 1 mg to 10 g per m$^2$.

The emulsion to be used in the present invention can contain various compounds for the purpose of preventing fog during the preparation, preservation or photographic processing of the light-sensitive material or stabilizing photographic performance properties. Such compounds include any conventional antifoggants or stabilizers, such as azoles, e.g., benzothiazolium salts, nitroimidazoles, nitrobenzimidazoles, chlorobenzimidazoles, bromobenzimidazoles, mercaptothiazoles, mercaptobenzothiazoles, mercaptobenzimidazoles, mercaptothiadiazoles, aminotriazoles, benzotriazoles, nitrobenzotriazoles, mercaptotetrazoles (especially 1-phenyl-5-mercaptotetrazole), etc.; mercaptopyrimidines; mercaptotriazines; thioketo compounds, e.g., oxazolinethione; azaindenes, e.g., triazaindenes, tetraazaindenes (especially 4-hydroxy-substituted (1,3,3a,7)tetraazaindenes), pentaazaindenes, etc.; benzenethiosulfonic acid, benzenesulfinic acid, benzenesulfonic acid amide, and the like. For example, those described in U.S. Pat. Nos. 3,954,474 and 3,982,947, Japanese Patent Publication No. 28660/77, etc. can be used.

In the preparation of the silver halide emulsions according to the present invention, gelatin is advantageously used as a protective colloid, but other hydrophilic colloids may also be employed. Examples of usable hydrophilic colloids include proteins, e.g., gelatin derivatives, graft polymers of gelatin and other high polymers, albumin, casein, etc.; cellulose derivatives, e.g., hydroxyethyl cellulose, carboxymethyl cellulose, cellulose sulfate, etc.; sugar derivatives, e.g., sodium alginate, starch derivatives, etc.; and a wide variety of synthetic hydrophilic high polymers, such as polyvinyl alcohol, polyvinyl alcohol partial acetal, poly-N-vinylpyrrolidone, polyacrylic acid, polymethacrylic acid, polyacrylamide, polyvinylimidazole, polyvinylpyrazole, etc. and copolymers comprising monomers constituting these homopolymers.

Gelatin to be used includes not only lime-processed gelatin, but acid-processed gelatin and enzyme-processed gelatin as described in *Bull. Soc. Sci. Photo. Japan*, No. 16, 30 (1966). Hydrolysis products or enzymatic decomposition products of gelatin may also be used.

The reducing agent which can be used in the present invention includes the compounds disclosed in U.S. Pat. No. 3,687,667 (corresponding to Japanese Patent Publication No. 20741/72), U.S. Pat. No. 3,697,275 (corresponding to Japanese Patent Publication No. 11149/70), U.S. Pat. No. 3,746,542 (corresponding to Japanese Patent Publication No. 10697/74) and Japanese Patent Publication Nos. 13863/82 and 169143/83, such as resorcins, aminophenols, phenylenediamines, 5-pyrazolones, alkylphenols, alkoxyphenols, naphthols, aminonaphthols, naphthalenediols, alkoxynaphthols, hydrazines, etc.

Specific examples of these reducing agents are resorcin, 2-methylresorcin, orcinol, phloroglucin, phloroglucin monomethyl ether, phloroglucin dimethyl ether, m-aminophenol, m-dimethylaminophenol, m-diethylaminophenol, N,N-dimethyl-m-phenylenediamine, N,N-diethyl-m-phenylenediamine, 3-methyl-5-pyrazolone, 3,4-dimethyl-5-pyrazolone, 1,3-dimethyl-5-pyrazolone, 1-phenyl-3-methyl-5-pyrazolone, p-ethylphenyl, p-dodecylphenol, p-methoxyphenol, p-benzyloxyphenol, p-hydroxydiphenyl ether, 4-methyl-1-naphthol, 2-methyl-1-naphthol, 1-methyl-2-naphthol, 6-amino-1-naphthol, 8-amino-2-naphthol, 1,3-dihydroxynaphthalene, 4-methoxy-1-naphthol, o-tolylhydrazine hydrochloride, p-tolylhydrazine hydrochloride, acetohydrazide, benzhydrazide, toluenesulfonylhydrazine, N,N'-diacetylhydrazine, β-acylphenylhydrazines, e.g., β-acetylphenylhydrazine, β-acetyl-ptolylhydrazine, β-acetyl-p-methoxyphenylhydrazine, β-acetyl-p-aminophenylhydrazine, β-formyl-p-aminophenylhydrazine, βformyl-2,4-dimethylphenylhydrazine, β-benzoyl-2,4-dimethoxyphenylhydrazine, β-butyroyl-p-tolylhydrazine, β-pivaloyl-pacetylaminophenylhydrazine, β-propionyl-p-dimethylaminophenylhydrazine, β-ethoxycarbonyl-p-aminophenylhydrazine, β-dimethylcarbamoyl-p-benzenesulfonamidophenylhydrazine, β-morpholinocarbonyl-p-aminophenylhydrazine, etc. These reducing agents can be used in combinations of two or more thereof, if desired. Further, these reducing agents may be used in combination with known developing agents for conventional photographic light-sensitive materials, such as hydroquinone, catechol, p-substituted aminophenols, p-phenylenediamines, 3-pyrazolidones, and the like. The amount of the reducing agent to be used can be varied widely, but usually ranges from 0.1 to 1,500 mol %, and preferably from 10 to 300 mol %, based on the amount of silver salts.

The polymerizable compound which can be used in the present invention includes addition polymerizable monomers and oligomers and polymers thereof. The addition polymerizable monomers include compounds having at least one carbon-carbon unsaturated bond. Examples of such compounds are acrylic acid and salts thereof, acrylic esters, acrylamides, methacrylic acid and salts thereof, methacrylic esters, methacrylamides, maleic anhydride, maleic esters, itaconic esters, styrenes, vinyl ethers, vinyl esters, N-vinyl hetero rings, aryl ethers, aryl esters, and derivatives of these compounds.

Any of the above-enumerated compounds are useful in the present invention, but those having a boiling point of 80° C. or higher that are hardly evaporated upon heating for heat development are preferred. Further, in order to increase a contrast of the resulting color image, it is desirable to use a crosslinkable compound having an activity to increase viscosity or hardness of the resulting polymeric compound. The crosslinkable compound as herein referred to is a so-called polyfunctional compound having a plurality of vinyl groups or vinylidene groups in its molecule. Specific examples of the polymerizable compounds which can be preferably used in the present invention are shown below.

Acrylic acid, methacrylic acid, butyl acrylate, methoxyethyl acrylate, butyl methacrylate, acrylamide, N,N-dimethylacrylamide, N,N-diethylacrylamide, N-acryloylmorpholine, N-acryloylpiperidine, glycidyl acrylate, 2-ethylhexyl acrylate, acrylic anilide, methacrylic acid anilide, styrene, vinyltoluene, chlorostyrene, methoxystyrene, chloromethylstyrene, 1-vinyl-2-methylimidazole, 1-vinyl-2-undecylimidazole, 1-vinyl-2-undecylimidazoline, N-vinylpyrrolidone, N-vinylcarbazole, vinylbenzyl ether, vinylphenyl ether, methylenebisacrylamide, trimethylenebisacrylamide, hexamethylenebisacrylamide, N,N'-diacryloylpiperazine, m-phenylenebisacrylamide, p-phenylenebisacrylamide, ethylene glycol diacrylate, propylene glycol dimethacrylate, diethylene glycol diacrylate, polyethylene glycol diacrylate, bis(4-acryloxypolyethoxyphenyl)propane, 1,5-pentanediol diacrylate, neopentyl glycol diacrylate, 1,6-hexanediol acrylate, polypropylene glycol diacrylate, pentaerythritol triacrylate, trimethylolpropane triacrylate, pentaerythritol tetraacrylate, N-methylolacrylamide, diacetonacrylamide, triethylene glycol dimethacrylate, and pentaerythritol tetraaryl ether.

In addition, polymeric compounds having a vinyl group or a vinylidene group, such as a condensation product between a polymeric compound having a hydroxyl group, an amino group, an epoxy group, a halogen atom or a sulfonyloxy group in its side chain and acrylic acid, methacrylic acid or a derivative thereof can also be utilized.

Further, compounds having the nucleus of the aforesaid reducing agent to which a vinyl group or a vinylidene group is bonded, such as m-N,N-di(acryloyloxyethyl)aminophenol, p-acryloyloxyethoxyphenol, etc., may also beuutilized as a polymerizable compound. In this case, such a compound serves as a reducing agent combined with a polymerizable compound. Furthermore, color image forming substances, e.g., dyes or leuco dyes, having a vinyl group in their molecule may also serve as a polymerizable compound combined with a color image forming substance.

The above-described polymerizable compound according to the present invention can be used in an amount of from 5 to $1.2 \times 10^5$ parts by weight, and preferably from 12 to $1.2 \times 10^4$ parts by weight, per part by weight of silver halide.

The color image forming substances which can be used in the present invention include various kinds. For example, those which are per se colored include dyes and pigments. When these substances are used, a color image can be formed by destroying microcapsules in the area where a polymeric compound is not formed and transferring the colored substance to an image-receiving material by an appropriate means. The dyes and pigments to be used include those commercially available and, in addition, various known compounds described in the technical literature, e.g., Yuki Gosei Kagaku Kyokai (ed.), *Senryo Binran* (1970) and Nippon Ganryo Gijutsu Kyokai (ed.), *Saishin Ganryo Brinran* (1977). These dyes or pigments are used in the form of a solution or dispersion.

On the other hand, non-colored color image forming substances are divided into those which develop a color by some energy, such as heating, pressure application, light irradiation, and the like, and those which do not develop a color by application of energy but develop a color upon contact with another component. Known examples of the former are thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light irradiation or air oxidation. Examples of the latter include various systems capable of developing a color through some reaction between two or more components, such as acid-base reaction, oxidation-reduction reaction, coupling reaction, chelating reaction, and the like. Such color formation systems specifically include a color formation system used in pressure sensitive papers, etc., comprising a color former having a partial structure of lactones, lactams, spiropyrans, etc., and an acidic substance (developer), e.g., acid clay, phenols, etc.; a system utilizing azo-coupling reaction between aromatic diazonium salts, diazotates or diazosulfonates and naphthols, anilines, active methylenes, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

Another known example of the color formation system utilizing a reaction between two components is a system in which such a reaction proceeds upon heating. In this system, heating is required simultaneously or immediately after the pressure application for microcapsule rupture by which the two components are mixed.

The color formers in the above-described color former/developer system include (1) triarylmethanes, (2) diphenylmethanes, (3) xanthenes, (4) thiazines, (5) spiropyrans, and the like. Specific examples of such color formers are described, e.g., in British Pat. 2,033,594 (corresponding to Japanese Patent Application (OPI) No. 27253/80). Among them, (1) triarylmethanes and (3) xanthenes are preferred since many of them cause less fog and provide high color densities. Specific examples of these color formers are Crystal Violet Lactone, 3-diethylamino-6-chloro-7-(β-ethoxyethylamino)fluoran, 3-diethylamino-6-methyl-7-anilinofluoran, 3-triethylamino-6-methyl-7-anilinofluoran, 3-cyclohexylmethylamiho-6-methyl-7-anilinofluoran, 3-diethylamino-7-o-chloroanilinofluoran, etc. These compounds may be used either alone or in combination thereof.

The developers which can be used include phenol compounds, organic acids, or metal salts thereof, hydroxybenzoic acid esters, acid clay, and the like.

Examples of the phenol compounds are 4,4'-isopropylidenediphenol (bisphenol A), p-t-butylphenol, 2,4-dinitrophenol, 3,4-dichlorophenol, 4,4'-methylenebis(2,6-di-t-butylphenol), p-phenylphenol, 1,1-bis(4-hydroxyphenyl)cyclohexane, 1,1-bis(4-hydroxyphenol)-2-ethylhexane, 2,2-bis(4-hydroxyphenyl)butane, 2,2'-methylenebis(4-t-butylphenol), 2,2'-methylenebis(α-phenyl-p-cresol)thiodiphenol, 4,4'-thiobis(6-t-butyl-m-cresol)sulfonyldiphenol and, in addition, a p-t-butylphenol-formalin -condensate, a p-phenylphenolformalin condensate, etc.

Examples of the organic acids or metal salts thereof include phthalic acid, phthalic anhydride, maleic acid, benzoic acid, gallic acid, o-toluylic acid, p-toluylic acid, salicyclic acid, 3-t-butylsalicyclic acid, 3,5-di-t-butylsalicyclic acid, 5-α-methylbenzylsalicyclic acid, 3,5-(α-methylbenzyl)salicyclic acid, 3-t-octylsalicyclic acid and salts of these acids with zinc, lead, aluminum, magnesium, nickel, etc. Of these, salicyclic acid derivatives and their zinc salts or aluminum salts are particularly excellent in terms of color developability, fastness of the developed image, preservability of recording sheets, and the like.

Examples of the hydroxybenzoic acid esters include ethyl p-hydroxybenzoate, butyl p-hydroxybenzoate, heptyl p-hydroxybenzoate, benzyl p-hydroxybenzoate, etc.

An oil-absorbing white pigment may be used in combination for the purpose of helping diffusion and fixing of the content of microcapsules.

In order to induce color formation reaction of the developer by melting at a desired temperature, it is preferable that the developer be added as an eutectic mixture with a low-melting point heat-fusible substance or be added in such a state that a low-melting point compound is fused to the surface of developer particles.

Specific but non-limiting examples of the low-melting point compound include higher fatty acid amides, e.g., stearamide, erucamide, palmitamide, ethylenebisstearamide, etc., waxes, such as higher fatty acid esters, phenyl benzoate derivatives, aromatic ether derivatives and urea derivatives.

The color former used in another color former/developer system include phenolphthalein, fluorescein, 2′,4′,5′,7′-tetrabromo-3,4,5,6-tetrachlorofluorescein, Tetrabromophenol Blue, 4,5,6,7-tetrabromophenolphthalein, Eosine, Aurin Cresol Red, 2-naphtholphenolphthalein, etc.

Developers which can be used in combination with the above-described color formers include nitrogen-containing compounds, such as organic or inorganic ammonium salts, organic amines, amides, urea or thiourea and derivatives thereof, thiazoles, pyrroles, pyrimidines, piperazines, guanidines, indoles, imidazoles, imidazolines, triazoles, morpholines, piperidines, amidines, formamidines, pyridines, etc. Specific examples of such developers are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N′-dibenzylpiperazine, 4,4′-dithiomorpholine, morpholinium trichloroacetate, 2-aminobenzothiazole, 2-benzoylhydrazinobenzothiazole, etc.

The color image forming substance according to the present invention is used in an amount of from 0.5 to 20 parts by weight, and preferably from 2 to 7 parts by weight, per 100 parts by weight of the polymerizable compound. The developer is used in an amount of from about 0.3 to about 80 parts by weight per part by weight of the color former.

Preservability of the light-sensitive material according to the present invention can be improved by incorporating a thermal polymerization inhibitor into microcapsules. The amount of the thermal polymerization inhibitor to be added preferably ranges from 0.1 to 10 mol % based on the polymerizable compound.

Microcapsules to be used in the present invention can be prepared by processes known in the art, for example, a process utilizing coacervation of hydrophilic wall-forming materials as described in U.S. Pat. Nos. 2,800,457 and 2,800,458; an interfacial polymerization process as described in U.S. Pat. No. 3,287,154, British Pat. No. 990,443 and Japanese Patent Publication Nos. 19574/63, 446/67 and 771/67; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like wall-forming materials as described in U.S. Pat. No. 4,025,455; an in situ process utilizing polymerization of monomers as described in British Patent 867,797 (corresponding to Japanese Patent Publication No. 9168/61) and U.S. Pat. No. 4,001,140 (corresponding to Japanese Patent Application (OPI) No. 9079/76); an electrolytic dispersion and cooling process as described in British Patents 952,807 and 965,074; a spray-drying process as described in U.S. Pat. No. 3,111,407 and British Pat. No. 930,422; and the like. It is preferable, though not limitative, that microcapsules are prepared by emulsifying core materials, followed by formation of a polymeric membrane as a microcapsule wall.

In particular, preferred effects can be obtained when encapsulation is carried out by polymerization of reactants supplied from the inside of oil droplets. According to this process, microcapsules having a uniform particle size and excellent working preservability, that are favorable for light-sensitive materials, can be obtained in a short time.

For example, if in using polyurethane as a capsule wall material, a polyisocyanate and a second component capable of reacting with a polyisocyanate to form a capsule wall, e.g., polyols or polyamines, are mixed in an oily liquid to be encapsulated, and the mixture is emulsified and dispersed in water. A temperature of the dispersion is then elevated to cause polymerization on the oil drop interface to thereby form microcapsule walls. In this case, a low-melting point auxiliary solvent having high dissolving power may be added to the oily liquid.

The polyisocyanates and polyols or polyamines that can be used in the above-described reaction are disclosed in U.S. Pat. Nos. 3,281,383, 3,773,695 and 3,793,268, British Pat. 1,127,338 (corresponding to Japanese Patent Publication No. 40347/73), U.S. Pat. Nos. 3,723,363 and 3,838,108 (corresponding to Japanese Patent Publication No. 24159/74 and Japanese Patent Application (OPI) No. 80191/73, respectively) and British Patent 1,416,224 (corresponding to Japanese Patent Application (OPI) No. 84086/73).

More specifically, examples of the polyisocyanates include diisocyanates, e.g., m-phenylene diisocyanate, p-phenylene diisocyanate, 2,6-tolylene diisocyanate, 2,4-tolylene diisocyanate, naphthalene-1,4-diisocyanate, diphenylmethane-4,4′-diisocyanate, 3,3′-dimethoxy-4,4′-biphenyldiisocyanate, 3,3′-dimethyldiphenylmethane-4,4′-diisocyanate, xylylene-1,4-diisocyanate, 4,4′-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, etc.;

triisocyanates, e.g., 4,4',4''-triphenylmethane triisocyanate, toluene-2,4,6-triisocyanate, etc.; tetraisocyanates, e.g., 4,4'-dimethyldiphenylmethane-2,2',5,5'-tetraisocyanate, etc.; and isocyanate prepolymers, e.g., an adduct of hexamethylene diisocyanate and trimethylolpropane, an adduct of 2,4-tolylene diisocyanate and trimethylolpropane, an adduct of xylylene diisocyanate and trimethylolpropane, an adduct of tolylene diisocyanate and hexanetriol, etc.

Examples of the polyols include aliphatic or aromatic polyhydric alcohols, hydroxypolyesters, hydroxypolyalkylene ethers, and the like. The following polyols described in Japanese Patent Application (OPI) No. 49991/85 can also be used: ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, pentaerythritol ethylene oxide adduct, a glycerin ethylene oxide adduct, glycerin 1,4-di(2-hydroxyethoxy)benzene, a condensation product of an aromatic polyhydric alcohol and an alkylene oxide, e.g., resorcinol dihydroxyethyl ether, etc., p-xylene glycol, m-xylylene glycol, $\alpha$, $\alpha'$-dihydroxy-p-diisopropylbenzene, 4,4'-dihydroxydiphenylmethane, 2-(p,p'-dihydroxyphenylmethyl)benzyl alcohol, an adduct of bisphenol A and ethylene oxide, etc. The polyol is preferably used in such an amount that the molar proportion of hydroxyl group to isocyanate group is from 0.02/1 to 2/1.

Examples of the polyamines include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylenepentamine, amine adducts of epoxy compounds, and the like.

The polyisocyanates can also form polymeric substances by reaction with water.

In the encapsulation, water-soluble high polymers can be employed. The water-soluble high polymers may be any of anionic high polymers, nonionic high polymers, and amphoteric high polymers. The anionic high polymers, either natural or synthetic, include those having, e.g., —COO$^-$, —SO$_3^-$, etc.

Examples of natural anionic high polymers include gum arabic, alginic acid, etc., and examples of semisynthetic anionic high polymers include carboxymethyl cellulose, phthalated gelatin, sulfated starch, sulfated cellulose, lignin sulfonic acid, etc. Examples of synthetic anionic high polymers are maleic anhydride (inclusive of a hydrolysate thereof) copolymers, acrylic (inclusive of methacrylic) polymers and copolymers, vinylbenzenesulfonic acid polymers and copolymers, carboxyl-modified polyvinyl alcohol, and the like. The nonionic high polymers include polyvinyl alcohol, hydroxyethyl cellulose, methyl cellulose, and the like. The amphoteric high polymers include gelatin, etc.

These water-soluble high polymers can be used as an aqueous solution at a concentration of from 0.01 to 10% by weight.

According to the present invention, the microcapsules contain at least a polymerizable compound and a color image forming substance as described above. It is usually preferable that the microcapsules further include a silver halide, a reducing agent, and the like. Such being the case, a silver halide and a reducing agent are dispersed or dissolved in the polymerizable compound having dissolved therein the color image forming substance to form an oily phase. The oily phase is then mixed with an aqueous phase having dissolved therein a hydrophilic polymeric compound, followed by emulsifying to prepare an emulsion. Simultaneously with or subsequently to the emulsification, capsule walls can be formed on the oil/water interface of the emulsion particles in a known manner. Microcapsules having no capsule wall, i.e., oil droplets, can be prepared in the same manner as described above, but using no wall-forming reactant. The above-described encapsulation process is not limitative, and other various processes can be applied.

The size of the microcapsules to be used in the invention is not greater than 80 $\mu$m. From the standpoint of preservability and handling property, a capsule size of not greater than 20 $\mu$m is preferred. Since microcapsules, if too small, are liable to vanish into voids or fibers of a substrate on which they are applied, the microcapsules preferably have a particle size not less than 0.1 $\mu$m, although such value is not necessarily critical, as it depends on the properties of the substrate or support.

It is preferable that the microcapsules to be used in the invention do not undergo substantial change under a pressure of about 10 kg/cm$^2$ or less, but are ruptured when a pressure higher than that is applied thereon. To this effect, microcapsules with capsule wall are preferable to oil droplets having no capsule wall. The pressure causing rupture of microcapsules is not limited to a particular value and can be varied according to the purposed use. However, the microcapsules are preferably ruptured under a pressure of about 2,000 kg/cm$^2$ or less. Such a pressure characteristic of microcapsules can be controlled by variation in particle size of microcapsules, thickness of capsule wall and kinds of wall materials to be used.

In order to change heat reactivity of the lightsensitive materials of the present invention, hydroxyl compounds, carbamic acid ester compounds, aromatic methoxy compounds or organic sulfonamide compounds as described in Japanese Patent Application No. 25838/85 can be used either inside or outside the microcapsules. These compounds are considered to change a glass transition point of the microcapsule wall.

In the present invention, a wide variety of image formation accelerators can be used. The image formation accelerators have a function to accelerate the oxidation-reduction reaction between a silver salt oxidizing agent and a reducing agent, a function to accelerate transfer of an image forming substance from a light-sensitive layer to an image-receiving layer, or a like function. From the physio-chemical standpoint, they are classified into base or base precursors, oils, hot-melt solvents, surface active agents, compounds having interaction with silver or a silver ion, and the like. These groups, however, generally have combined functions, i.e., two or more of the above-mentioned effects.

Specific examples of these image formation accelerators classified according to function for the sake of convenience are shown below. It should be noted, however, that one compound often has a plurality of functions combined.

Preferred examples of the bases are inorganic bases, such as hydroxides, secondary or tertiary phosphates, borates, carbonates, quinolinates and metaborates of alkali metals or alkaline earth metals; hydroxides of quaternary alkylammoniums; and hydroxides of other metals, and organic bases, such as aliphatic amines (e.g., trialkylamines, hydroxylamines, aliphatic polyamines); aromatic amines (e.g., N-alkyl-substituted aromatic amines, N-hydroxylalkyl-substituted aromatic amines and bis(p-(dialkylamino)phenyl)methanes, heterocyclic amines, amidines, cyclic amidines, guanidines, cyclic guanidines, and the like. Of these, those having a pKa of 8 or more are preferred.

The base precursors preferably include those capable of releasing bases upon some reaction by heating, such as salts of organic acids capable of decarboxylation by heating and bases, compounds capable of releasing amines through intramolecular nucleophilic substitution, Lossen rearrangement, or Beckmann rearrangement, and the like; and those capable of releasing bases by electrolysis. Preferred examples of the former base precursors which generate bases upon heating include salts of trichloracetic acid as described in British Pat. No. 998,949, etc.; salts of α-sulfonylacetic acid as described in U.S. Pat. No. 4,060,420; salts of propiolic acids as described in Japanese Patent Application (OPI) No. 180537/84; 2-carboxycarboxamide derivatives as described in U.S. Pat. No. 4,088,496; salts of heat-decomposable acids and organic bases as well as alkali metals or alkaline earth metals as a base component as described in Japanese Patent Application (OPI) No. 195237/84; hydroxamcarbamates which generate bases through Lossen rearrangement as described in Japanese Patent Application (OPI) No. 168440/84; aldoxime carbamates which generate nitriles by heating as described in Japanese Patent Application (OPI) No. 157637/84; and the like. In addition, base precursors described in British Pat. No. 998,945, U.S. Pat. No. 3,220,846, Japanese Patent Application (OPI) No. 22625/75, British Patent 2,079,480, etc., are also useful.

The compounds which produce bases by electrolysis include those subject to electrolytic oxidation and those subject to electrolytic reduction. The former compounds typically include various fatty acid salts. Electrolytic oxidation of these compounds produce carbonates of organic bases, such as alkali metals, guanidiens, amidiens, etc., with extremely high efficiency.

The latter compounds which are subject to electrolytic reduction to form bases include nitro compounds and nitroso compounds for formation of amines; nitriles for formation of amines; nitro compounds, azo compounds, azoxy compounds, etc., for formation of p-aminophenols, p-phenylenediamines, hydrazines, etc., and the like. The p-aminophenols, p-phenylenediamines, and hydrazines can be used not only as bases but also as color image forming substances per se. Electrolysis of water in the presence of various inorganic salts to form alkali components may also be utilized.

These bases or base precursors are preferably used in an amount of not more than 50% by weight, and more preferably from 0.01 to 40% by weight, based on the total solid content of a light-sensitive layer.

The oils to be used include high-boiling organic solvents which are used as solvents in emulsification and dispersion of hydrophobic compounds.

The hot-melt solvents which can be used are solid in ambient temperature but act as solvents upon melting in the vicinity of development temperatures and include urethanes, amides, pyridines, sulfonamides, sulfones, sulfoxides, esters, ketones and ethers whose melting points are not higher than 40° C. The hot-melt solvent is preferably used in an amount of from 0.5 to 50% by weight, and more preferably from 1 to 20% by weight, based on the total solid content of a light-sensitive layer.

The surface active agents which can be used include pyridinium salts, ammonium salts and phosphonium salts as described in Japanese Patent Application (OPI) No. 74547/84; polyalkylene oxides as described in Japanese Patent Application (OPI) No. 57231/84; and the like.

The compounds having interaction with silver or a silver ion include imides, nitrogen-containing heterocyclic compounds as described in Japanese Patent Application (OPI) No. 177550/84, thiols as described in Japanese Patent Application (OPI) No. 111636/84, thioureas, thioethers, and the like.

The above-described image formation accelerators can be incorporated in the light-sensitive material and/or the image-receiving material. The layer to which they may be added may be any of an emulsion layer, an intermediate layer, a protective layer and an image-receiving layer and layers adjacent to these layers. They are incorporated into the structures having a light-sensitive layer and an image receiving layer on the same support in the same manner as described above.

These image formation accelerators may be used either alone or in combinations of two or more thereof. In general, use of combinations produces greater accelerating effects. In particular, a combined use of a base or a base precursor and other accelerators exerts significant accelerating effects.

In the present invention, various development stopping agents can be used for the purpose of ensuring constant image quality against variations in temperature and time of heat development. The development stopping agents as herein referred to are compounds that neutralize a base or react with a base to reduce a base concentration in the layer to thereby stop development, or compounds that mutually react with silver or a silver salt to suppress development. More specifically, the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxime esters as described, e.g., in Japanese Patent Application (OPI) Nos. 108837/85 and 192939/85 and compounds which release acids through Lossen rearrangement as described in Japanese Patent Application No. 85834/84. Examples of the electrophilic compounds which induce substitution reaction with bases upon heating include compounds disclosed in Japanese Patent Application No. 85836/84.

The light-sensitive materials according to the present invention can further contain a thermal polymerization initiator. In this case, the polymerization reaction induced by the thermal polymerization initiator is imagewise inhibited by a reducing agent remaining non-oxidized after heat development or an oxidation product of a reducing agent produced by heat development. As a result, imagewise polymerization takes place to form a polymer image, by which a color image forming substance can be immobilized to provide a positive image. In some cases, a negative image can be formed to the contrary by selecting the thermal polymerization initiator to be used.

The thermal polymerization initiators which can be used in the present invention generally include compounds that are decomposed under heat to generate a polymerization initiating species, particularly a radical, and those commonly employed as initiators of radical polymerization, for example, the compounds described in Fuka Jugo.Kaikan Jugo (Addition Polymerization and Ring Opening Polymerization), pages 6–18, edited by The Editorial Committee of High Polymer Experimental Study of the High Polymer Institute, published by Kyoritsu Shuppan (1983), can be suitably applied to the present invention. Specific examples are azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), azobisdimethylvaleronitrile, etc.; organic peroxides, e.g., benzoyl peroxide, di-t-butyl peroxide, dicumyl peroxide, t-butyl hydroperoxide, cumene hydroperoxide, etc.; inorganic peroxides, e.g., sodium p-toluenesulfinate, hydrogen peroxide, potassium persulfate, ammonium persulfate, etc.; and the like. In addition to these initiators that are employed individually, two-component redox initiator systems which generate a radical by redox reaction between the two components may also be used. For example, combinations of the above-described inorganic or organic peroxides and reducing agents, e.g., iron (II) salts, sodium hydrogensulfite, dimethylaniline, etc., can be used.

The image-receiving element according to the present invention is an element in which a color image forming substance released from a light-sensitive element is fixed. It is provided on the same support as for the light-sensitive element, or it is provided on another support separately from the light-sensitive material having the light-sensitive element to form an image-receiving material.

The image-receiving element according to the invention can contain, if desired, at least one layer containing a mordant. When the image-receiving element is positioned on the surface, a protective layer may be provided thereon. If desired, the image-receiving element may be composed of two or more layers containing two or more mordants different in mordanting power from each other.

In the case of using a mordant as an image-receiving layer, it can be arbitrarily selected from those employed for diffusion transfer type light-sensitive materials. Among them, polymeric mordants are particularly preferred. The polymeric mordants include polymers containing a tertiary amino group, polymers containing a nitrogen-containing heterocyclic moiety, polymers containing a quaternary cation group derived from a tertiary amino group or a nitrogen-containing heterocyclic moiety, and the like.

The polymers containing vinyl monomer units having a tertiary amino group are described, e.g., in Japanese Patent Application (OPI) Nos. 60643/85 and 57836/85, etc.; and the polymers containing vinyl monomer units having a tertiary imidazole group are described, e.g., in Japanese Patent Application (OPI) Nos. 118834/85 and 122941/85, U.S. Pat. Nos. 4,282,305, 4,115,124 and 3,148,061, etc.

Preferred examples of the polymers containing vinyl monomer units having a quaternary imidazolium salt are given in British Pat. Nos. 2,056,101, 2,093,041 and 1,594,961, U.S. Pat. Nos. 4,124,386, 4,115,124, 4,273,853 and 4,450,224, Japanese Patent Application (OPI) No. 28225/73, etc.

In addition, preferred examples of the polymers containing vinyl monomer units containing a quaternary ammonium salt are described, e.g., in U.S. Pat. Nos. 3,709,690, 3,898,088 and 3,958,995, Japanese Patent Application (OPI) Nos. 57836/85, 60643/85, 122940/85 and 122942/85.

In the present invention, solvents can be used in the encapsulation of a polymerizable compound and a color image forming substance. Solvents may also be employed in the introduction of a reducing agent, a developer, etc., in a desired element. For example, a solution of a desired compound dissolved in water or a hydrophilic organic solvent can be directly coated on a support, if necessary, together with a binder, or can be introduced in a desired element according to the method as described in U.S. Pat. No. 2,322,027, or the like method. By the use of solvents in microcapsules, the degree of capsule rupture caused by pressure application and the amount of a color image forming substance within capsules to be transferred to an image receiving element can be controlled. The amount of the solvent to be used in the microcapsules preferably ranges from 1 to 500 parts by weight per 100 parts by weight of a polymerizable compound.

The solvents to be used in the present invention include natural oils and synthetic oils, either individually or in combination. Specific examples of these solvents are cottonseed oil, kerosine, aliphatic ketones, aliphatic esters, paraffin oil, naphthenic oil, alkylated biphenyls, alkylated terphenyls, diarylethanes (e.g., 1-phenyl-1-xylylethane, 1-phenyl-1-p-ethylphenylethane, 1,1'-ditolylethane, etc.), alkyl phthalates (e.g., dibutyl phthalate, dioctyl phthalate, etc.), phosphoric esters (e.g., diphenyl phosphate, triphenyl phosphate, tricresyl phosphate, dioctylbutyl phosphate, etc.), citric esters (e.g., acetyl tributyl citrate, etc.), benzoic esters (e.g., octyl benzoate, etc.), alkylamides (e.g., diethyllaurylamide, etc.), fatty acid esters (e.g., dibutoxyethyl succinate, dioctyl azelate, etc.), trimesic esters (e.g., tributyl trimesate, etc.), lower alkyl acetates (e.g., ethyl acetate, butyl acetate, etc.), ethyl propionate, sec-butyl alcohol, methyl isobutyl ketone, $\beta$-ethoxyethyl acetate, methyl cellosolve acetate, cyclohexanone, and the like.

Binders which can be used in the light-sensitive materials and image-receiving materials of the present invention typically include transparent or semi-transparent hydrophilic binders, for example, natural substances, such as proteins, e.g., gelatin, gelatin derivatives, cellulose derivatives, etc., and polysaccharides, e.g., starch, gum arabic, etc.; and synthetic polymeric substances, such as water-soluble polyvinyl compounds, e.g., polyvinylpyrrolidone, acrylamide polymers, etc. In addition, vinyl compounds dispersed in the form of latex, which are particularly effective to increase dimensional stability of photographic materials, can also be used. These binders may be used alone or in combinations thereof.

Supports to be used in the light-sensitive materials and image-receiving materials of the present invention should withstand heat at the processing temperature. Generally employed supports include glass, paper, coat paper, synthetic paper, metals and analogues thereof; acetyl cellulose films, cellulose ester films, polyvinyl acetal films, polystyrene films, polycarbonate films, polyethylene terephthalate films and other films and resin materials related thereto. Paper supports laminated with polymers, e.g., polyethylene, can also be used. Polyester films as described in U.S. Pat. Nos. 3,634,089 and 3,725,070 are preferably employable.

If desired, the light-sensitive materials according to the present invention can be coated with a protective layer, an intermediate layer, an antistatic layer, an anti-curl layer, a release layer, a matting agent layer, or a like auxiliary layer. In particular, the protective layer preferably contains an organic or inorganic matting agent for the purpose of preventing adhesion.

The light-sensitive material and the image-receiving material may contain, if desired, antifoggants, fluorescent brightening agents, discoloration inhibitors, antihalation dyes, anti-irradiation dyes or pigments (inclusive of white pigments, e.g., titanium oxide), water releasers to release water during heating, thermal polymerization inhibitors, surface active agents, hot-melt solvents to assist the transfer of the substances in the reaction system which are solid at ordinary temperature and are in melted state when heated, and the like.

A latent image is obtained by imagewise exposure to radiation including visible light. Various exposure means can be used in the present invention, and, in general, commonly employed light sources may be used, such as sunlight, flash light sources, e.g., an electronic flash and a flash bulb, a tungsten lamp, a mercury lamp, a halogen lamp, e.g., an iodine lamp, a xenon lamp, a laser ray, a CRT, a plasma light source, a fluorescent lamp, a light-emitting diode, etc. In addition, a combination of a micro-shutter array utilizing LCD (liquid crystal display) or PLZT (lanthanumdoped lead zirconate titanate) and a linear or planar light source may also be used. The type of light source used and the exposure can be selected depending on the light-sensitive wavelengths due to spectral sensitization of silver halides or sensitivity.

Originals which can be applied to the present invention may be either monochromatic images or color images and include line images, such as drawings, as well as photographic images having a continuous tone. The light-sensitive materials of the invention can also be used for taking a picture of a portrait or a scene by the use of a camera. Printing from an original can be carried out by contact printing or reflex printing by intimately contacting the light-sensitive material to the original or by enlarging printing.

It is also possible to print images photographed by a video camera, etc., or image informations transmitted from a TV station by directly displaying these images by CRT or FOT (Fiber Optical Tube) and converting the resulting signals to an image on the light-sensitive material by contact printing or printing through a lens.

Light-emitting diodes (LED), recently being remarkable developed, have seen increasing utility as an exposure means or a display means in a wide variety of apparatuses. However, it has been difficult to produce an LED which can effectively emit blue light. Such being the case, color images can be reproduced by using three kinds of LEDs, emitting green light, red light, and infrared light, respectively, and designing the light-sensitive material in such a manner that the emulsion layers sensitive to these lights contain a yellow, magenta, and cyan image forming substance, respectively. More specifically, the light-sensitive material is so designed that the green-sensitive emulsion layer contains a yellow image forming substance, the red-sensitive emulsion layer contains a magenta image forming substance, and the infrared-sensitive emulsion layer contains a cyan image forming substance. If desired, other combinations of a light-sensitive emulsion layer and an image forming substance may also be applied.

In addition to the above-described exposure processes by directly contacting an original with the light-sensitive material or projecting the original on the light-sensitive material, image formation can be effected by a process which comprises putting an original irradiated by a light source into memory of a readout computer, etc., through a receptor element, e.g., a phototube, a CCD, etc., processing the memorized information as necessary (i.e., image processing), reproducing the image information in a CRT, and utilizing it as an imagewise light source, or a process which comprises directly causing three kinds of LEDs to emit light according to the informations processed as described above.

The exposure employed in these processes varies depending on the kind or degree of sensitization of silver halides used.

Heating after the imagewise exposure can be conducted in a known manner, for example, by directly contacting the light-sensitive material with a hot plate or drum, or by passing the light sensitive material using a heat roller. Heating may be affected by using air heated to high temperatures, high frequency radiation, or a laser beam. An infrared heater may also be used for heating some kinds of light-sensitive materials. Further, heating may be affected by utilizing eddy currents generated by electromagnetic induction. The light-sensitive material may be heated in a bath of a heated liquid inert to the material, for example, a fluorine-containing liquid.

In addition to the above-described heating means, heating may be carried out by incorporating a heat source in light-sensitive materials as disclosed in Japanese Patent Application No. 135568/85. For example, a layer comprising conductive particles, such as carbon black or graphite, i.e., a conductive film, any be provided in the light-sensitive material, and electricity is passed therethrough to generate Joule's heat.

The conductive film may have any desired electrical resistance by selecting a proportion of the conductive material to binders, a method of dispersion, properties of binders, and the like, but preferably has the volume resistance of from 0.01 to 10 $\Omega$cm, and more preferably from 0.1 to 1 $\Omega$cm, in this invention.

The conductive film may be composed of a single layer or multiple layers. It is particularly advantageous to provide an appropriate protective layer for the purpose of reducing dependence of resistivity on environmental moisture and increasing physical strength against bending, folding, abrasion, etc.

The conductive material is generally used in an amount of from 10 to 90% by weight, and preferably from 15 to 85% by weight, based on the weight of the conductive film. Particularly favorable results can be obtained when carbon black is used as a conductive material in an amount of from about 0.1 to about 50 g per m$^2$, and preferably from about 0.5 to about 20 g per m$^2$. A carbon black content in this case ranges from about 10 to about 90% by weight, and preferably from about 15 to about 80% by weight, based on the binder.

The above-described conductive film preferably has a film thickness of from 0.5 to 15 $\mu$m.

Electricity can be passed by, for example, fixing electrodes to the conductive film. The electric current to be applied may be either direct current or alternating current, and the voltage can be determined by the aforesaid volume resistance and a desired temperature. Electricity can be carried not only at a constant voltage but also with a constant current by devising an appropriate circuit. In the former case, a voltage of not more than 1 KV is preferred from the standpoint of safety.

The above-described conductive film and a photographic layer, e.g., a light-sensitive layer, an image-receiving layer, etc., may be provided on the same side or opposite side with respect to a support.

Heating temperatures for the light-sensitive materials of the present invention usually ranges from 80° to 200° C., and preferably from 100° to 160° C. Various heating patterns are applicable. For example, a method of heating at a constant temperature is most commonly employed. According to the characteristics of the light-sensitive material to be processed, a method of multi-stage heating which comprises, for example, heating the light-sensitive material at a high temperature for a short period of time, followed by gradually lowering the heating temperature, is effectively employed. In this case, the heating time is usually from 1 second to 5 minutes, and preferably from 5 seconds to 1 minute.

In cases where the light-sensitive material is susceptible to air oxidation upon heating, it is effective that the air in the surroundings is degassed or replaced with an inert gas. The surface of the light-sensitive material may be brought into direct contact with a heating surface or be exposed to air. In the case where development is carried out with the surface of the light-sensitive material being exposed to air, it is effective to conduct heating under a cover for the purpose of preventing evaporation of volatile components or preserving the heat.

As described above, the light-sensitive material according to the present invention comprises a support having carried thereon at least a light-sensitive silver halide emulsion, a reducing agent, a polymerizable compound and a color image forming substance, with at least the polymerizable compound and the color image forming substance being encapsulated in the same microcapsules, and said silver halide emulsion being capable of forming a latent image upon imagewise exposure. The light-sensitive material having such characteristics has high sensitivity and excellent stability with time.

This invention will now be illustrated in greater detail with reference to the following examples, but it should be understood that they are not intended to limit the present invention.

EXAMPLE 1

Preparation of Image-Receiving Material

In 200 ml of water were dispersed 65 parts (by weight, hereinafter the same) of precipitated calcium carbonate, 35 parts of aluminum hydroxide (H-10, produced by Showa Denko K.K.), a ground mixture of 1.8 parts of a styrene-$\alpha$-methylstyrene decamer and 8.2 parts of zinc 3,5-di-$\alpha$-methylbenzylsalicylate, 10 parts of zinc oxide and 1 part of sodium hexametaphosphate, followed by dispersing in a sand mill to prepare a dispersion having a mean particle size of 2.6 $\mu$m. To the dispersion were added 9 parts of polyvinyl alcohol, 20 parts of a carboxyl-modified SBR latex (48 wt %) and 110 parts of water, followed by thoroughly stirring. The resulting coating composition was coated on base paper having a basis weight of 43 g/m$^2$ to a solid coverage of 5.2 g/m$^2$ and dried to obtain an image-receiving material.

Preparation of Light-Sensitive Material

In 200 ml of methanol was suspended 15 g of silver behenate in a dark room, and a solution of 20 mg of ammonium bromide and 5 mg of ammonium iodide in 10 ml of methanol was added to the suspension in small portions. After the mixture was vigorously stirred for 10 minutes, a precipitate formed was collected by filtration to obtain a light-sensitive silver behenate emulsion.

Two grams of the thus prepared silver behenate emulsion, 5 g of N,N'-diacryloylpiperazine, 3 g of pentaerythritol tetraacrylate, 0.5 g of Crystal Violet Lactone, 6 g of phenylxylylethane, 1 g of a 3:1 adduct of tolylene diisocyanate and trimethylolpropane, 0.3 g of a 1:4 adduct of ethylenediamine and propylene oxide and 4 ml of ethyl acetate were mixed and dissolved.

The resulting solution was mixed with a solution of 3 g of polyvinyl alcohol in 30 ml of water, and the mixture was dispersed in a sand mill. To the dispersion was then added 100 ml of water while stirring, followed by heating at 50° C. for 2 hours to form microcapsules having a mean particle size of 10 $\mu$m. To the capsule dispersion was added 5 wt % of SBR (styrene butadiene rubber), and the resulting coating composition was coated on a polyethylene terephthalate film to a wet thickness of 40 $\mu$m and dried.

A mixture consisting of a solution of 250 mg of m-dimethylaminophenol in 5 ml of methanol, 1 ml of a 1 wt % aqueous solution of sodium dodecylbenzenesulfonate, 5 mg of an adduct of formaldehyde and sodium bisulfite and 30 ml of a 4 wt % gelatin aqueous solution was then coated thereon, followed by drying to obtain a light-sensitive material.

The resulting light-sensitive material was imagewise exposed to light (2,000 lux) for 5 seconds using a tungsten lamp and then heated on a hot plate heated at 90° C. for 30 seconds. The exposed and heated light-sensitive material was brought into contact with the above prepared image-receiving material and passed through press rolls, whereby a clear blue image was obtained in the areas corresponding to the unexposed areas.

EXAMPLE 2

Preparation of Light-Sensitive Silver Halide Emulsion: Emulsion I

Solution A: 13 g of benzotriazole and 3 g of polyvinylbutyral dissolved in 100 ml of isopropyl alcohol.
Solution B: 17 g of silver nitrate dissolved in water to make 50 ml.
Solution C: 2.38 g of potassium bromide and 0.17 g of potassium iodide dissolved in water to make 50 ml.

Solution A was placed in a reaction vessel, and Solution B was added thereto over 5 minutes while thoroughly stirring at 40° C. After the elapse of 5 minutes from the end of the above addition, Solution C was further added thereto over 5 minutes. The mixture was stirred for 5 minutes and then filtered. To the mother liquor was added 200 ml of a 20 wt % isopropyl alcohol solution of polyvinyl butyral, and the mixture was dispersed in a homogenizer for 20 minutes to prepare Emulsion I in a yield of 250 g.

Emulsion II

Solution A: 3 g of polyvinyl butyral in 200 ml of isopropyl alcohol.

Solution B: 17 g of silver nitrate dissolved in water to make 20 ml.

Solution C: 11.9 g of potassium bromide and 0.83 g of potassium iodide dissolved in water to make 50 ml.

Solution A was place in a reaction vessel, and Solutions B and C were simultaneously added to Solution A over 10 minutes while thoroughly stirring at 40° C. After the elapse of 5 minutes from the end of the addition, the mixture was filtered, and to the solid was added 200 ml of a 20 wt % isopropyl alcohol solution of polyvinyl butyral, followed by dispersing in a homogenizer for 20 minutes to obtain Emulsion II in a yield of 250 g.

Emulsion III

Solution A: 12 g of gelatin, 5.6 g of sodium chloride and 0.6 g of potassium bromide in 1,000 ml of water.

Solution B: 100 g of silver nitrate dissolved in water to make 300 ml.

Solution C: 40 g of sodium chloride and 20 g of potassium bromide dissolved in water to make 300 ml.

Solution A was placed in a reaction vessel, and Solutions B and C were simultaneously added thereto over 90 minutes while maintaining the temperature at 50° C. After excess salts were removed from the resulting silver chlorobromide emulsion in a known manner, 70 g of water was added thereto, and the emulsion was adjusted to a pH of 6.0. The emulsion was subjected to gold-sulfur sensitization to obtain 400 g of Silver Chlorobromide Emulsion III.

Emulsion IV

Solution A: 10 g of gelatin and 3 g of sodium chloride in 1,000 ml of water.

Solution B: 100 g of silver nitrate dissolved in water to make 600 ml.

Solution C: 6 g of sodium chloride and 56 g of potassium bromide dissolved in water to make 600 ml.

Solution A was placed in a reaction vessel, and Solutions B and C were simultaneously added thereto over 40 minutes while maintaining at 75° C. to prepare a mono-dispersed cubic silver chlorobromide emulsion having a mean grain size of 0.35 μm. After washing with water to remove salts, the emulsion was subjected to chemical sensitization with sodium thiosulfate and 4-hydroxy-6-methyl-1,3,3a,7-tetraazaindene to obtain 600 g of Emulsion IV.

Emulsion V

Emulsion V in which a dye was absorbed on silver halide grains was prepared in the same manner as described for Emulsion IV except that Solution D comprising 160 mg of a dye having the following formula dissovled in 400 ml of methanol was added to Solution A simultaneously with Solutions B and C over 40 minutes.

Emulsion VI

Emulsion VI in which a dye was adsorbed on silver halide grains was prepared in the same manner as for Emulsion IV except that Solution E comprising 160 mg of a dye having the following formula dissolved in 400 ml of methanol was added to Solution A simultaneously with Solutions B and C over a period of 40 minutes.

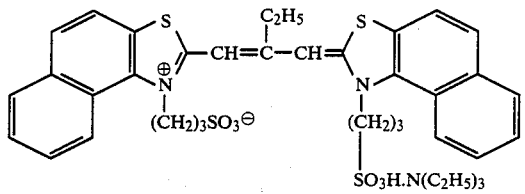

Preparation of Microcapsules

To a monomer mixture of 28 g of trimethylolpropane triacrylate and 7 g of methyl methacrylate was added 0.7 g of N-phenylglycine (Component c) and dissolved therein by an ultrasonic dispersing machine. Separately, 6 g of methylene chloride, 0.7 g of Component (a) and 2.1 g of Component (b) as shown in Table 1 and 2.1 g of 3-diethylamino-6-chloro-7-anilinofluoran as a color former were mixed and dissolved, and the resulting solution was added to the above prepared solution to obtain an oily phase.

A mixture consisting of 17.5 g of a 10 wt % aqueous solution of gum arabic, 18.8 g of a 12 wt % aqueous solution of an isobutylene/maleic anhydride copolymer and 26.8 g of distilled water was adjusted to a pH of 3.5 with sulfuric acid, and 4.6 g of urea and 0.6 g of resorcin were added thereto. To above prepared oily phase was emulsified in the solution so as to have a dispersed particle size of 3 μm. To the dispersion was added 12.9 g of 36% formalin (36 wt % of formaldehyde solution), and the liquid temperature was raised up to 60° C. while stirring. One hour later, 9.0 g of a 5 wt % aqueous solution of ammonium sulfate was added thereto, followed by stirring for 1 hour while maintaining at 60° C. After cooling, the dispersion was adjusted to a pH of 9.0 with sodium hydroxide. The resulting microcapsule dispersion was designated as Dispersion 1.

Dispersion 2 was prepared in the same manner as for Dispersion 1 but using 3.5 g of benzoin butyl ether in place of Components (a), (b) and (c). Dispersions 3 to 5 were prepared in the same manner as for Dispersion 1 but using Emulsion (I), (II), or (III) in an amount indicated in Table 1 in place of Components (a) to (c) and further adding 0.03 g of β-acetyl-p-aminophenylhydrazine to the monomer mixture.

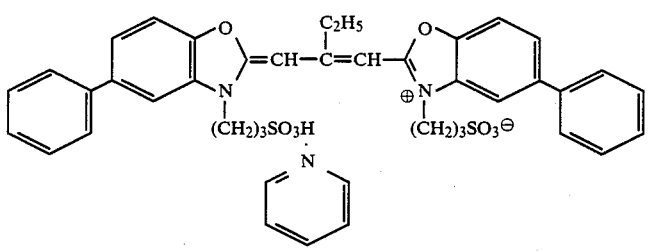

Preparation of Light-Sensitive Material and Image-Receiving Material

Five grams of each of Dispersions 1 to 5, 1.53 g of a 15 wt % aqueous solution of polyvinyl alcohol, 3.47 g of distilled water and 0.57 g of starch were mixed, and the resulting coating composition was coated on coat paper with a coating rod 10 (coating amount of 17.5 cc/m²) and dried at 50° C. for 15 minutes to obtain a light-sensitive material (Sample Nos. 1 to 5).

A mixture of 21.8 g of water, 0.6 g of a 48 wt % SBR latex, 4 g of a 10 wt % aqueous solution of etherified starch, 2.1 g of zinc carbonate, 1.3 g of a 50 wt % aqueous solution of sodium silicate, 0.1 g of sodium hexametaphosphate and 13 g of acid clay was stirred in a homogenizer for 15 minutes, and the resulting composition was coated on coat paper with a coating rod 18 (coating amount of 31.5 cc/m²), followed by drying at 100° C. for 2 minutes to obtain an image-receiving material.

Each of the light-sensitive materials was irradiated through an original of a line image with light having a wavelength of from 350 to 500 nm obtained from an ultra-high pressure mercury lamp through a band pass filter. After the exposure, Sample Nos. 3 to 5 were heated at 120° C. for 30 seconds. The exposed light-sensitive material and the image-receiving material were brought into contact with each other with their coated layer facing to each other and then passed through press rolls under a linear pressure of 100 kg/cm. The microcapsules in the unexposed areas were thereby destroyed and transferred to the image-receiving material to form a clear black image having a density of 1.0. Since the density of areas corresponding to the exposed areas vary depending on the exposure, the minimum exposure which provided a density of 0.1 or less was taken as sensitivity (i.e., toe sensitivity). The lower the minimum exposure energy, the higher the sensitivity. The results obtained are shown in Table 1.

EXAMPLE 3

Capsule Dispersions 6, 7, and 8 were prepared in the same manner as for Dispersion 1 of Example 2 except for replacing Components (a) to (c) with 7.5 g of Emulsion IV, V or VI as prepared in Example 2 and replacing the color former, 3-diethylamino-6-chloro-7-anilinofluoran, with the same amount (2.1 g) of a compound shown in Table 2.

Five grams of each of Dispersions 6 to 8, 1.53 g of a 15 wt % aqueous solution of polyvinyl alcohol, 3.47 g of distilled water and 0.57 g of starch were mixed, and the resulting coating composition was coated on coat paper with a coating rod 20 (coating amount of 35 cc/m²) and dried at 50° C. for 15 minutes to obtain a light-sensitive material (Sample Nos. 6 to 8).

Each of the resulting samples was exposed to light shown in Table 2, followed by heating at 120° C. for 30 seconds. The exposed sample was processed in the same manner as described in Example 2 to form a color as shown in Table 2 below on the image-receiving material.

TABLE 2

| Sample No. | Emulsion | Color Former | Light for Exposure | Color Formed |
|---|---|---|---|---|
| 6 | IV | React Yellow (produced by Badishe Anilin & Soda Fabarik A.G.) | red light | red |
| 7 | V | Pargascript Red (produced by Ciba-Geigy Ltd.) | green light | green |
| 8 | VI | Crystal Violet Lactone | blue light | blue |

When these light-sensitive materials are exposed to light through a transparent positive image, such as a commonly employed slide, and heated and pressed in the same manner as above, a positive image can be obtained in the image-receiving material.

EXAMPLE 4

TABLE 1

| Sample No. | Component (a) | Component (b) | Component (c) | Component (d) | Exposure Energy (erg/cm²) |
|---|---|---|---|---|---|
| 1 (Comparison) | 4,4'-bis(diethylamino)-benzophenone | 2,2'-bis(o-chlorophenyl)-4,4',5,5'-tetraphenyl-biimidazole | N-phenylglycine | none | 10,000 |
| 2 (Comparison) | benzoinbutyl ether | | | none | 80,000 |
| 3 (Invention) | Emulsion I (18 g) | | | β-acetyl-p-aminophenyl-hydrazine (0.03 g) | 100 |
| 4 (Invention) | Emulsion II (18 g) | | | β-acetyl-p-aminophenyl-hydrazine (0.03 g) | 100 |
| 5 (Invention) | Emulsion III (5 g) | | | β-acetyl-p-aminophenyl-hydrazine (0.03 g) | 10 |

As can be seen from the results of Table 1 above, the light-sensitive materials according to the present invention (Sample Nos. 3 to 5) exhibited markedly improved sensitivity as compared with Sample Nos. 1 and 2, in which no silver halide emulsion was used.

Preparation of Silver Benzotriazole Emulsion

In 3,000 ml of water were dissolved 28 g of gelatin and 13.2 g of benzotriazole, and the solution was kept at 40° C. while stirring. A solution of 17 g of silver nitrate in 100 ml of water was added to the solution over 2 minutes. Excess salts were sedimented and removed from the resulting silver benzotriazole emulsion by pH-adjustment. Thereafter, the emulsion was adjusted to a pH of 6.30 to obtain a silver benzotriazole emulsion in a yield of 400 g.

Preparation of Silver Chlorobromide Emulsion

In 1,000 ml of water were dissolved 20 g of gelatin and 3 g of sodium chloride, and the solution was kept at 75° C. while stirring. To the aqueous gelatin solution were added simultaneously 600 ml of an aqueous solution containing sodium chloride and potassium chloride and a silver nitrate aqueous solution consisting of 0.59 mol of silver nitrate and 600 ml of water at the equal flow rate over a period of 40 minutes. There was obtained a mono-dispersed cubic silver chlorobromide emulsion (bromine content: 80 mol %) having a mean grain size of 0.35 $\mu$m.

After desalting by washing with water, 5 mg of sodium thiosulfate and 20 mg of 4-hydroxy-6-methyl-1,3,3a,7-tetraazaindene were added thereto to effect chemical sensitization at 60° C. The yield of the emulsion was 600 g.

Preparation of Oil Dispersion

To a monomer mixture consisting of 28 g of trimethylolpropane triacrylate, 0.66 g of Miketon Fast Yellow 7G (produced by Mitsui Petrochemical Industries, Ltd.) and 7 g of methyl methacrylate was added 3.5 g of benzoin isobutyl ether (photopolymerization initiator) dissolved in 6 g of methylene chloride to form an oily phase. The oily phase was mixed with 60 g of a 10 wt % aqueous solution of polyvinyl alcohol containing 1 g of sodium dodecylbenzenesulfonate while stirring, and the mixture was dispersed in a homogenizer at 18,000 rpm for 5 minutes to prepare a dispersion of oil droplets having a mean particle size of 0.5 $\mu$m. The resulting dispersion was designated as Oil Dispersion I.

Oil Dispersion II was prepared in the same manner as described above, except using no photopolymerization initiator.

Preparation of Light-Sensitive Material

Five grams of Oil Dispersion I was mixed with 5 g of a 10 wt % polyvinyl alcohol aqueous solution, 5 g of distilled water and 0.5 g of starch, and the resulting coating composition was coated on a polyethylene terephthalate film to a wet thickness of 20 $\mu$m and dried to obtain a light-sensitive material. This light-sensitive material was designated as Sample No. 9.

Five grams of Oil Dispersion II was mixed with 2 g of a 10 wt % polyvinyl alcohol aqueous solution, 1 g of the above prepared silver chlorobromide emulsion, 4 g of the above prepared silver benzotriazole emulsion, 2 g of distilled water and 0.5 g of starch, and a solution of 0.05 g of $\beta$-acetyl-p-aminophenylhydrazine in 1 ml of methanol was added thereto to prepare a coating composition. The coating composition was coated on a polyethylene terephthalate film to a wet thickness of 20 $\mu$m and dried to obtain a light-sensitive material (Sample No. 10).

Sample No. 11 was prepared in the same manner as for Sample No. 10 except for replacing the solution of $\beta$-acetyl-p-aminophenylhydrazine with a solution of 0.02 g of p-aminophenol and 0.04 g of 8-acetylphenylhydrazine in 1 ml of methanol.

Preparation of Image-Receiving Material

To 125 g of water was added 11 g of a 40 wt % aqueous solution of sodium hexametaphosphate, and 34 g of zinc 3,5-di-$\alpha$-methylbenzylsalicylate and 82 g of a 55 wt % calcium carbonate slurry were added thereto. The mixture was coarsely dispersed in a mixer, and the coarse dispersion was further dispersed in a Dynamill dispersing machine. To 200 g of the resulting dispersion were added 6 g of a 50 wt % SBR latex and 55 g of a 8 wt % polyvinyl alcohol aqueous solution and uniformly mixed therewith. The resulting coating composition was coated on coat paper having a basis weight of 43 g/m$^2$ to a wet thickness of 30 $\mu$m and dried to obtain an image-receiving material.

Each of Sample Nos. 9 to 11 was imagewise exposed to light using a light source shown in Table 3. Sample Nos. 10 and 11 were further subjected to heat treatment at 125° C. for 40 seconds. Then, the thus exposed light-sensitive material was brought into contact with the above-described image-receiving material and passed through press rolls under a pressure of 200 kg/cm$^2$ to thereby obtain a clear yellow positive image on the image-receiving material according to the exposure. The minimum exposure required for providing a density of 0.1 or less is shown in Table 3.

TABLE 3

| Sample No. | Light Source | Exposure Energy (erg/cm$^2$) |
|---|---|---|
| 9 (Comparison) | ultra-high pressure mercury lamp | 10,000 |
| 10 (Invention) | halogen lamp | 50 |
| 11 (Invention) | " | 80 |

It can be seen from the results of Table 3 that the present invention makes it possible to obtain an image with an extremely reduced energy as compared with the conventional image recording processes and also with an exposure means easy to handle, such as a halogen lamp.

EXAMPLE 5

Preparation of Light-Sensitive Silver Halide Emulsion: Emulsion A

In 1,000 ml of water were dissolved 20 g of gelatin and 3 g of sodium chloride, and the gelatin aqueous solution was kept at 75° C. while sufficiently stirring. To the gelatin aqueous solution were added simultaneously 600 ml of an aqueous solution containing potassium bromide and sodium chloride in a total amount of 0.59 mol and 600 ml of an aqueous solution containing 0.59 mol of silver nitrate at the equal flow rate over a period of 40 minutes. There was obtained a mono-dispersed emulsion of cubic silver chlorobromide grains having a silver bromide content of 80 mol % and a mean grain size of 0.5 $\mu$m. After washing with water and desalting, 5 g of gelatin and 200 ml of water were added to the emlsion. After pH-adjustment, the emulsion was subjected to the optimum chemical sensitization using sodium thiosulfate, chloroauric acid and 4-hydroxy-6-methyl-1,3,3a,7-tetraazaindene. The yield of the emulsion was 700 g. The resulting emulsion was designated as Emulsion A.

Emulsion B

In 1,000 ml of water were dissolved 20 g of gelatin and 2 g of sodium chloride, and the solution was kept at 60° C. while stirring well. To the aqueous gelatin solution were added simultaneously 600 ml of an aqueous solution containing potassium bromide and sodium chloride in a total amount of 0.59 mol and 600 ml of an aqueous solution containing 0.59 mol of silver nitrate at the equal flow rate over 25 minutes. Simultaneously with the commencement of silver halide grain formation, a solution of 0.16 g of Dye I of the following formula in 400 ml of methanol was added to the gelatin aqueous solution over 15 minutes. A monodispersed emulsion of silver chlorobromide grains having a bromine content of 80 mol % and a mean grain size of 0.25 μm was obtained. After washing with water and desalting, 5 g of gelatin and 200 ml of water were added thereto, and the pH of the emulsion was adjusted. The emulsion was then subjected to chemical sensitization under the optimum conditions using sodium thiosulfate, chloroauric acid and 4-hydroxy-6-methyl-1,3,3a,7-tetraazaindene. The yield of the emulsion was 700 g. The resulting emulsion was designated as Emulsion B.

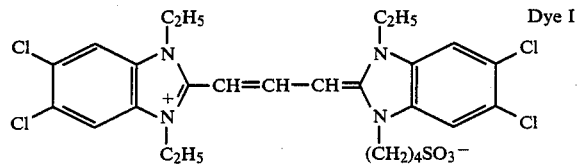

Dye I

Emulsion C

In 1,000 ml of water were dissolved 20 g of gelatin and 10 g of sodium chloride, and the solution was kept at 75° C. while stirring well. To the aqueous gelatin solution were added 600 ml of an aqueous solution containing potassium bromide and sodium chloride in a total amount of 0.59 mol and 600 ml of an aqueous solution of 0.59 mol of silver nitrate over 60 minutes. Five minutes before the commencement of grain formation, a dye solution of 0.16 g of Dye II in 160 ml of methanol was added to the gelatin aqueous solution. There was obtained an emulsion of cubic silver chlorobromide grains having a bromine content of 55 mol % and a mean grain size of 0.65 μm. After washing with water and desalting, 5 g of gelatin and 200 ml of water were added to adjust the pH of the emulsion, and the emulsion was subjected to chemical sensitization under the optimum conditions using sodium thiosulfate and a nucleic acid decomposition product. The yield of the emulsion was 700 g. The resulting emulsion was designated as Emulsion C.

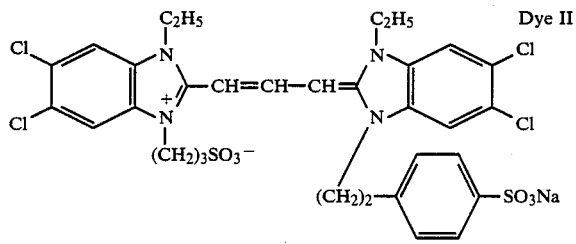

Dye II

Emulsion D

Emulsion D was prepared in the same manner as for Emulsion B except that addition of Dye I was effected immediately after completion of the chemical sensitization instead of the addition during the silver halide grain formation.

Emulsion E

Emulsion E was prepared in the same manner as for Emulsion C except that addition of Dye II was effected immediately after completion of the chemical sensitization instead of the addition to the gelatin aqueous solution.

Emulsion F

In a beaker containing 600 ml of water were charged 20 g of gelatin, 1.2 g of potassium bromide and 6 ml of 25 wt % aqueous ammonia, followed by stirring to form a solution. While keeping the solution at 50° C., a solution of 100 g of silver nitrate in 600 ml of water and a solution of 116 g of potassium bromide and 4 g of potassium iodide in 100 ml of water were added thereto according to a controlled double jet method by maintaining the pAg of the system at 8.9 over a period of 50 minutes. Simultaneously with the commencement of the addition of the halides solution and the silver nitrate solution, a solution of 0.15 g of Dye III of the following formula in 75 ml of methanol was added over a period of 25 minutes.

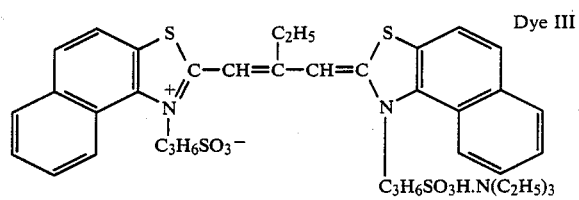

Dye III

After washing with water and desalting, 5 g of gelatin and 100 ml of water were added thereto to adjust the pH, and potassium bromide was then added thereto to adjust to a pAg of 0.3. The emulsion was subjected to chemical sensitization under the optimum conditions using sodium thiosulfate to obtain 700 g of a panchromatically sensitized silver iodobromide emulsion having a potato-like grain form and a mean grain size of 0.5 μm. This emulsion was designated as Emulsion F.

Emulsion G

In a beaker containing 600 ml of water were charged 20 g of gelatin, 1.2 g of potassium bromide and 0.5 g of HO—CH$_2$)$_2$S—CH$_2$)$_2$S—CH$_2$)$_2$OH, followed by stirring to form a solution. While maintaining the solution at 60° C., a solution of 0.15 g of Dye III as used in Emulsion F in 75 ml of methanol and a solution of 0.05 g of Dye IV having the following formula in 125 ml of methanol were added thereto. Thereafter, a solution of 100 g of silver nitrate in 600 ml of water and a solution of 64 g of potassium bromide and 10 g of potassium iodide in 600 ml of water were added thereto over a period of 50 minutes. After washing with water and desalting, 5 g of gelatin and 100 ml of water were added thereto to adjust the pH, and potassium bromide was then added to adjust to a pAg of 8.5. The emulsion was subjected to chemical sensitization under the optimum conditions using sodium thiosulfate and 4-hydroxy-6-methyl1,3,3a,7-tetraazaindene to obtain 700 g of a panchromatically sensitized silver iodobromide emulsion having a potatolike grain form and a mean grain size of 0.3 μm. This emulsion was designated as Emulsion G.

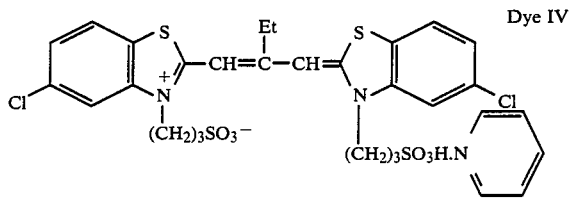

Dye IV

Emulsion H

Emulsion H was prepared in the same manner as Emulsion F, except that the addition of Dye III was effected immediately after completion of the chemical sensitization instead of the addition during the silver halide grain formation.

Emulsion I

Emulsion I was prepared in the same manner as for Emulsion G except that the addition of Dye III and Dye IV were conducted immediately after the chemical sensitization instead of the addition to the gelatin solution.

Preparation of Microcapsules

To a monomer mixture of 28 g of trimethylolpropane triacrylate and 7 g of methyl methacrylate was added 2.1 g of 3-diethylamino-6-chloro-7-anilinofluoran, a color former, dissolved in 8 g of methylene chloride. Nine grams of Emulsion A was added to the monomer mixture.

A mixture consisting of 17.5 g of a 10 wt % aqueous solution of gum arabic, 81.5 g of a 12 wt % aqueous solution of an isobutylene/maleic anhydride copolymer and 26.5 g of distilled water was adjusted to a pH of 3.5 with sulfuric acid, and 4.6 g of urea and 0.6 g of resorcin were added thereto. In the resulting solution was dispersed the aboveprepared monomer mixture containing a silver halide to form a dispersion having a dispersed particle size of 3 μm. Then, 12.9 g of 36% formalin was added thereto, followed by heating to 60° C. while stirring. One hour later, 9.0 g of a 5 wt % aqueous solution of ammonium sulfate was added to the dispersion. The dispersion was further stirred at 60° C. for 1 hour, followed by cooling. The dispersion was then adjusted to a pH of 9.0 with sodium hydroxide.

Preparation of Light-Sensitive Material

Five grams of the thus prepared capsule dispersion was mixed with 1.53 g of a 15 wt % polyvinyl alcohol aqueous solution, 3.47 g of distilled water, 0.57 g of starch and 5.5 mg of β-acetyl-p-aminophenylhydrazine to prepare a coating composition. The coating composition was coated on coat paper with a coating rod 10 (coating amount of 17.5 cc/m²) and dried at 50° C. for 15 minutes to obtain a light-sensitive material. This product was designated as Sample No. 12.

Sample Nos. 13 to 20 were prepared in the same manner as for Sample No. 12, except using Emulsions B to I in place of Emulsion A, respectively.

Preparation of Image-Receiving Material

To 21.8 g of water were added 0.6 g of a 48 wt % SBR latex, 4 g of a 10 wt % aqueous solution of etherified starch, 2.1 g of zinc carbonate, 1.3 g of a 50 wt % sodium silicate aqueous solution, 0.1 g of sodium hexametaphosphate and 13 g of acid clay, and the mixture was stirred in a homogenizer for 15 minutes. The resulting coating composition was coated on coat paper with a coating rod 18 (coating amount of 31.5 cc/m²) and dried at 100° C. for 2 minutes to obtain an image-receiving material.

Each of Sample Nos. 12 to 20 was exposed to light having a wavelength of 400 to 700 nm through an original of a line image by the use of a halogen lamp. After the exposure, the sample was heated at 120° C. for 30 seconds. The light-sensitive material and the above-described image-receiving material were brought into contact with their coated layers facing to each other and passed through press rolls under a linear pressure of 100 kg/cm. The microcapsules in the unexposed areas were thereby destroyed and transferred to the image-receiving material to form a clear black image having a density of 1.0. The sensitivity of the sample was evaluated in the same manner as described in Example 2, and that of Sample No. 12 was taken as 100 (standard).

Further, the sample was preserved at 40° C. and 70% RH for one day and then evaluated for sensitivity in the same manner as above.

TABLE 4

| | | | Relative Sensitivity | |
|---|---|---|---|---|
| Sample No. | Emulsion | Color Sensitivity | Immediately After Preparation | After Reservation at 40° C., 70% RH for 1 day |
| 12 (Comparison) | A | blue-sensitivity | 100 | 98 |
| 13 (Invention) | B | green-sensitivity | 100 | 99 |
| 14 (Invention) | C | green-sensitivity | 100 | 97 |
| 15 (Comparison) | D | green-sensitivity | 96 | 91 |
| 16 (Comparison) | E | green-sensitivity | 94 | 87 |
| 17 (Invention) | F | red-sensitivity | 100 | 97 |
| 18 (Invention) | G | red-sensitivity | 100 | 98 |
| 19 (Comparison) | H | red-sensitivity | 92 | 84 |
| 20 (Comparison) | I | red-sensitivity | 95 | 89 |

Making a comparison of the light-sensitive materials having green- or red-sensitivity, it can be seen that Sample Nos. 13, 14, 17, and 18 according to the present invention exhibit higher sensitivity immediately after the preparation and are significantly relieved from reduction in sensitivity with time as compared with Sample Nos. 15, 18, 19 and 20. It can further be seen from the results of Sample No. 12 that sensitivity reduction with time is less when no sensitizing dye is employed.

EXAMPLE 6

Microcapsule Dispersions a to e were prepared in the same manner as described in Example 5, except using the emulsions as prepared in Example 5 as shown in Table 5 and replacing 3-diethylamino-6-chloro-7-anilinofluoran with a color former shown in Table 5.

TABLE 5

| Microcapsule Dispersion | Emulsion and Its Amount | Color Former and Its Amount | | Color Upon Image Formation |
|---|---|---|---|---|
| a | A 9 g | 4-(4-dimethyl-aminophenol)-2,6- | 1.5 g | yellow |

TABLE 5-continued

| Microcapsule Dispersion | Emulsion and Its Amount | Color Former and Its Amount | | Color Upon Image Formation |
|---|---|---|---|---|
| | | diphenylpyridine | | |
| b | B 9 g | 3,3-bis(2-methyl-1-octyl-3-indole)-phthalide | 2.6 g | magenta |
| c | D 9 g | 3,3-bis(2-methyl-1-octyl-3-indole)-phthalide | 2.6 g | " |
| d | G 9 g | Crystal Violet Lactone | 1.8 g | cyan |
| e | I 9 g | Crystal Violet Lactone | 1.8 g | " |

A coating composition was prepared by adding 3 g of a 15 wt % polyvinyl alcohol aqueous solution, 2 g of distilled water and 16.5 mg of β-acetyl-p-aminophenylhydrazine to a combination of the above prepared capsule dispersions as shown in Table 6. The resulting coating composition was coated on coat paper with a coating rod 20 (coating amount of 35 cc/m²) and dried at 50° C. for 15 minutes to obtain a light-sensitive material (Sample Nos. 21 and 22).

Each of Sample Nos. 21 and 22 was exposed to light of 400 to 700 nm through an original of a color image by means of a halogen lamp and then heated at 120° C. for 30 seconds. The exposed light-sensitive material and the same image-receiving material as used in Example 5 were brought into contact with their coated layers facing to each other and passed through press rolls under a linear pressure of 100 kg/cm. The microcapsules in the unexposed areas were thereby destroyed and transferred to the image-receiving material to obtain an image having the same color as the original. In the above process, if desired, a hue of the reproduced image may be optionally changed by varying a proportion of blue light, green light and red light for exposure by means of a filter.

Then, the light-sensitive material was processed in the same manner as described above, except controlling the proportion of blue light, green light, and red light by the use of a blue, green or red filter so that the reflection density of the reproduced image became 1.0 in each case. The same prcedure as above was repeated except for using the light-sensitive material having been preserved at 25°C. for one month, and the reflection density of the resulting image was measured. An increase in reflection density over the density obtained immediately after the preparation (1.0) indicates reduction in sensitivity due to preservation. In this evaluation, test conditions were set so that the reproduced image had a gray color.

The results obtained are shown in Table 6 below.

TABLE 6

| Sample No. | Capsule Dispersion | | Increase of Density With Time | | |
|---|---|---|---|---|---|
| | | | Blue Filter | Green Filter | Red Filter |
| 21 (Invention) | a | 5 g | | | |
| | b | 5 g | 0.03 | 0.03 | 0.04 |
| | d | 5 g | | | |
| 22 (Comparison) | a | 5 g | | | |
| | c | 5 g | 0.03 | 0.32 | 0.45 |
| | e | 5 g | | | |

The results of Table 6 prove that the light-sensitive material according to the present invention undergoes little change in sensitivity, i.e., little change in density, with time passage under the conditions for image reproduction being the same.

EXAMPLE 7

| Preparation of Support: | | |
|---|---|---|
| (a) Carbon black having a particle size of 20 μm and a DBP oil absorption number of 150 | 24 | g |
| (b) Gelatin | 35 | g |
| (c) Demol N (produced by Kao Atlas Co., Ltd.) | 2.6 | g |
| (d) Nissan Nonion NS208.5 (produced by Nissan Chemicals Industries, Ltd.) | 1.4 | g |
| (e) Aerosol OT (produced by American Cyanamide Corp.) | 5 | g |
| (f) Water | 960 | ml |

The above components (a) to (f) were mixed and dispersed in a colloid mill to prepare a carbon black dispersion. The dispersion was coated on polyethylene-laminated paper to a wet coverage of 70 ml/m² and dried to form an electrically conductive film.

Preparation of Light-Sensitive Material

Light-sensitive materials (Sample Nos. 23 to 27) were prepared in the same manner as for Sample Nos. 1 to 5 of Example 2, respectively, but using the above prepared support.

Each of the resulting light-sensitive materials was exposed to light having a wavelength of from 350 to 500 nm which was obtained from an ultra-high pressure mercury lamp through a bandpass filter through an original of a line image. The exposed light-sensitive material was then heated by applying direct voltage of 240 V for 30 seconds. The light-sensitive material and the same image-receiving material as used in Example 2 were brought into contact with their coated layers facing to each other and passed through press rolls under a linear pressure of 100 kg/cm. The microcapsules in the unexposed areas were thereby destroyed and transferred to the image-receiving material to provide a clear black image having a density of 1.0. The sensitivity (toe sensitivity) of the samples was determined from the exposure energy in the same manner as described in Example 2, and the results obtained are shown in Table 7 below.

TABLE 7

| Sample No. | Components Used | Exposure Energy (erg/m²) |
|---|---|---|
| 23 (Comparison) | 4,4'-Bis(diethylamino)benzophenone | 10,000 |
| | 2,2'-bis(o-chlorophenyl)-4,4',5,5'-tetraphenylbiimidazole | |
| | N—Phenylglycine | |
| 24 (Comparison) | Benzoisobutyl ether | 80,000 |
| 25 (Invention) | Emulsion (I) | 100 |
| | β-Acetyl-p-aminophenylhydrazine | |
| 26 (Invention) | Emulsion (II) | 100 |
| | β-Acetyl-p-aminophenylhydrazine | |
| 27 (Invention) | Emulsion (III) | 10 |
| | β-Acetyl-p-aminophenylhydrazine | |

The results of Table 7 prove that the light-sensitive materials according to the present invention (Sample Nos. 25 to 27) exhibit markedly improved sensitivity over those containing no silver halide emulsion (Sample Nos. 23 and 24). Further, it was confirmed that the light-sensitive materials according to the present invention fail to provide an image if they are not heated after exposure by, for example, application of voltage, thus proving effectiveness of the image recording process of this invention.

EXAMPLE 8

Preparation of Light-Sensitive Microcapsules

To 25 g of a 10 wt % aqueous solution of gum arabic was added 27 g of a solution consisting of 5.0 g of an isobutylene/maleic anhydride copolymer, 2.0 g of sodium hydroxide and 30.0 g of water while stirring. Forty grams of water was added thereto, followed by heating to 60° C. The mixture was adjusted to a pH of 4.0 with sulfuric acid, and 6.6 g of urea and 0.8 g of resorcin were added thereto while stirring. The pH of the mixture was again adjusted to 4.0 to prepare an aqueous phase.

| | |
|---|---|
| Solution A: | |
| Pentaerythritol tetraacrylate | 50 g |
| 3-Dimethylamino-6-methyl-7-anilinofluoran | 3 g |
| 1,1'-Azobis(1-cyclohexanecarbonitrile) | 3 g |
| Methylene chloride | 50 g |
| Solution B: | |
| Silver chlorobromide emulsion (silver chlorobromide (Cl/Br molar ratio = 1/1) content: 10 wt %; gelatin content: 7 wt %) | 20 g |
| Formaldehyde (5 wt % aqueous solution) | 2 g |
| Benzotriazole | 2 g |

Solution B was added to Solution A and emulsified therein by stirring in a homogenizer at a high speed (about 10,000 rpm) at 30° C. for 10 minutes to prepare an oily phase (water-in-oil emulsion).

The whole quantity of the oily phase was added to the above prepared aqueous phase, followed by stirring to prepare a water-in-oil-in-water type double emulsion. The emulsion was heated at 60° C., and 20 g of formalin (a 37 vol % formaldehyde aqueous solution) was added thereto while stirring. The stirring was continued for an additional 2 hours.

Thirteen grams of a 5 wt % aqueous solution of ammonium sulfate was added thereto, and the emulsion was adjusted to a pH of 9.0 with an aqueous solution of sodium hydroxide. Three grams of sodium bisulfite was then added to the emulsion to complete encapsulation. The resulting microcapsules had a particle size of about 5 μm.

Preparation of Light-Sensitive Material

Ten grams of the above prepared microcapsule slurry, g of a 10 wt % aqueous solution of polyvinyl alcohol (average degree of polymerization: ca. 500), 0.3 g of sorbitol and 3 g of a solution of 0.3 g of 4-methyl-1-phenyl-3-pyrazolidone in 3 g of methanol were mixed by sufficiently stirring, and the resulting coating composition was coated on paper to a wet thickness of about 20 μm and dried to obtain a light-sensitive material.

All of the above-described procedures were conducted in a dark room.

Preparation of Image-Receiving Material

To 200 g of water were added 6 g of a 50 wt % aqueous solution of a styree-butadiene latex, 40 g of a 10 wt % aqueous solution of 1.5% ethylated starch, 17 g of hydrated silica gel, 21 g of zinc carbonate, 13 g of a 47 wt % sodium silicate aqueous solution, 1 g of sodium hexametaphosphate and 130 g of Silton F-150 Clay, and the mixture was stirred at room temperature for 1 hour. To the mixture was added 0.1 g of formalin. The resulting coating composition was coated on paper to wet thickness of about 20 μm and dried to prepare an image-receiving material.

The above prepared light-sensitive material was exposed to light (50 lux) of a halogen lamp for 2 seconds through a black-and-white step wedge (difference in optical density: 0.3) and then heated on a hot plate at 125° C. for 8 seconds.

The light-sensitive material was brought into contact with the above-described image-receiving material and passed through press rolls whereby a black image composed of 6 steps which was negative to the wedge original was formed on the area of the image-receiving material corresponding to the exposed area.

EXAMPLE 9

The same procedures of Example 8 were repeated except that the light-sensitive material further contained 0.3 g of triethanolamine. There was formed a black image composed of 6 steps which was positive to the wedge original was formed on the area corresponding to the unexposed area.

While the invention has ben described in detail and with reference to specific embodiments thereof, it will be apparent to one skilled in the art that various changes and modifications can be made therein without departing from the spirit and scope thereof.

What is claimed is:

1. An image recording method which comprises imagewise exposing a light-sensitive material comprising a support having provided thereon a light-sensitive layer containing at least a light-sensitive silver halide, a reducing agent, a polymerized compound, and a color image forming substance, wherein at least said polymerizable compound and said color image forming substance are encapsulated in the same microcapsules, to form a latent image in the light-sensitive silver halide without causing polymerization of the polymerizable compound, heating the light-sensitive material either simultaneously with or after the imagewise exposure to polymerize the polymerizable compound, to thereby cure the microcapsules, and pressing the light-sensitive material in contact with an image-receiving material to which said color image forming substance can be transferred, to rupture at least part of the microcapsules in the area wherein said polymerizable compound has not been polymerized, to thereby transfer said color image forming substance to said image-receiving material.

2. An image recording method as in claim 1, wherein said color image forming substance is a dye or a pigment.

3. An image recording method as in claim 1, wherein said color image forming substance is a color former and said image-receiving material contains a developer.

4. An image recording method as in claim 1, wherein said heating is carried out at a temperature of from 80° to 200° C., for a period of time sufficient to develop said light-sensitive silver halide.

5. An image recording method as in claim 1 wherein said pressing is carried out under a pressure of not less than 10 kg/cm².

6. An image recording method as in claim 1, wherein said heating is from 1 second to 5 minutes.

7. An image recording method as in claim 1, wherein said heating is from 5 seconds to 1 minute.

* * * * *

UNITED STATES PATENT AND TRADEMARK OFFICE
CERTIFICATE OF CORRECTION

PATENT NO. : 4,912,011

DATED : March 27, 1990

INVENTOR(S) : Yamamoto, et al.

It is certified that error appears in the above-identified patent and that said Letters Patent is hereby corrected as shown below:

Column 38, line 26 delete "ben" and insert -- been --.

Column 38, line 35 (Claim 1, line 5), delete "polymerized compound" and insert -- polymerizable compound --.

Signed and Sealed this

Fifth Day of November, 1991

Attest:

HARRY F. MANBECK, JR.

Attesting Officer

Commissioner of Patents and Trademarks